(12) United States Patent
Son

(10) Patent No.: US 10,631,439 B2
(45) Date of Patent: Apr. 21, 2020

(54) DISPLAY DEVICE

(71) Applicant: LG ELECTRONICS INC., Seoul (KR)

(72) Inventor: Heeseung Son, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/308,792

(22) PCT Filed: Jun. 10, 2016

(86) PCT No.: PCT/KR2016/006177
§ 371 (c)(1),
(2) Date: Dec. 10, 2018

(87) PCT Pub. No.: WO2017/213279
PCT Pub. Date: Dec. 14, 2017

(65) Prior Publication Data
US 2019/0254195 A1    Aug. 15, 2019

(51) Int. Cl.
*H05K 7/20* (2006.01)
*H04N 5/64* (2006.01)
(Continued)

(52) U.S. Cl.
CPC ..... *H05K 7/20509* (2013.01); *G02F 1/133308* (2013.01); *H04N 5/64* (2013.01); *H04N 5/645* (2013.01); *H04N 5/65* (2013.01); *H05K 5/0047* (2013.01); *H05K 7/10* (2013.01); *H05K 7/142* (2013.01); *H05K 7/20963* (2013.01);
(Continued)

(58) Field of Classification Search
CPC ..... G02F 1/133308; G02F 2001/133314; G02F 1/33308; H05K 7/20509; H05K 5/0047; H05K 7/10; H05K 7/142; H05K 7/20963; H01R 12/73
See application file for complete search history.

(56) References Cited

U.S. PATENT DOCUMENTS

| 7,456,807 | B2 * | 11/2008 | Mizuno ............. | H04N 5/64 345/60 |
| 2004/0027073 | A1 | 2/2004 | Nomoto et al. | |
| 2009/0279002 | A1 * | 11/2009 | Xie ............. | G06F 1/16 348/836 |

FOREIGN PATENT DOCUMENTS

| EP | 1796384 | 6/2007 | |
| KR | 20050099621 | * 10/2005 | ............ H04N 5/64 |

(Continued)

OTHER PUBLICATIONS

PCT International Application No. PCT/KR2016/006177, International Search Report dated Feb. 22, 2017, 4 pages.

*Primary Examiner* — James Wu
*Assistant Examiner* — Hung Q Dang
(74) *Attorney, Agent, or Firm* — Lee, Hong, Degerman, Kang & Waimey PC

(57) ABSTRACT

A display device is disclosed. The display device includes a display panel; a frame positioned in a rear of the display panel; a back cover positioned in a rear of the frame; a controller installed between the frame and the back cover; a control module movable between the frame and the back cover; and a bridge unit installed between the frame and the back cover, electrically connected to the controller, and electrically connected to the control module when the control module is inserted between the frame and the back cover.

9 Claims, 22 Drawing Sheets

(51) Int. Cl.
  *H04N 5/645* (2006.01)
  *H04N 5/65* (2006.01)
  *G02F 1/1333* (2006.01)
  *H05K 5/00* (2006.01)
  *H05K 7/10* (2006.01)
  *H05K 7/14* (2006.01)
  *H01R 12/73* (2011.01)

(52) U.S. Cl.
  CPC .. *G02F 2001/133314* (2013.01); *H01R 12/73* (2013.01); *H01R 2201/18* (2013.01)

(56) References Cited

FOREIGN PATENT DOCUMENTS

| KR | 1020060040674 |   | 5/2006  |            |
|----|---------------|---|---------|------------|
| KR | 100657644     | * | 12/2006 | G10H 1/368 |
| KR | 100714166     |   | 5/2007  |            |

\* cited by examiner

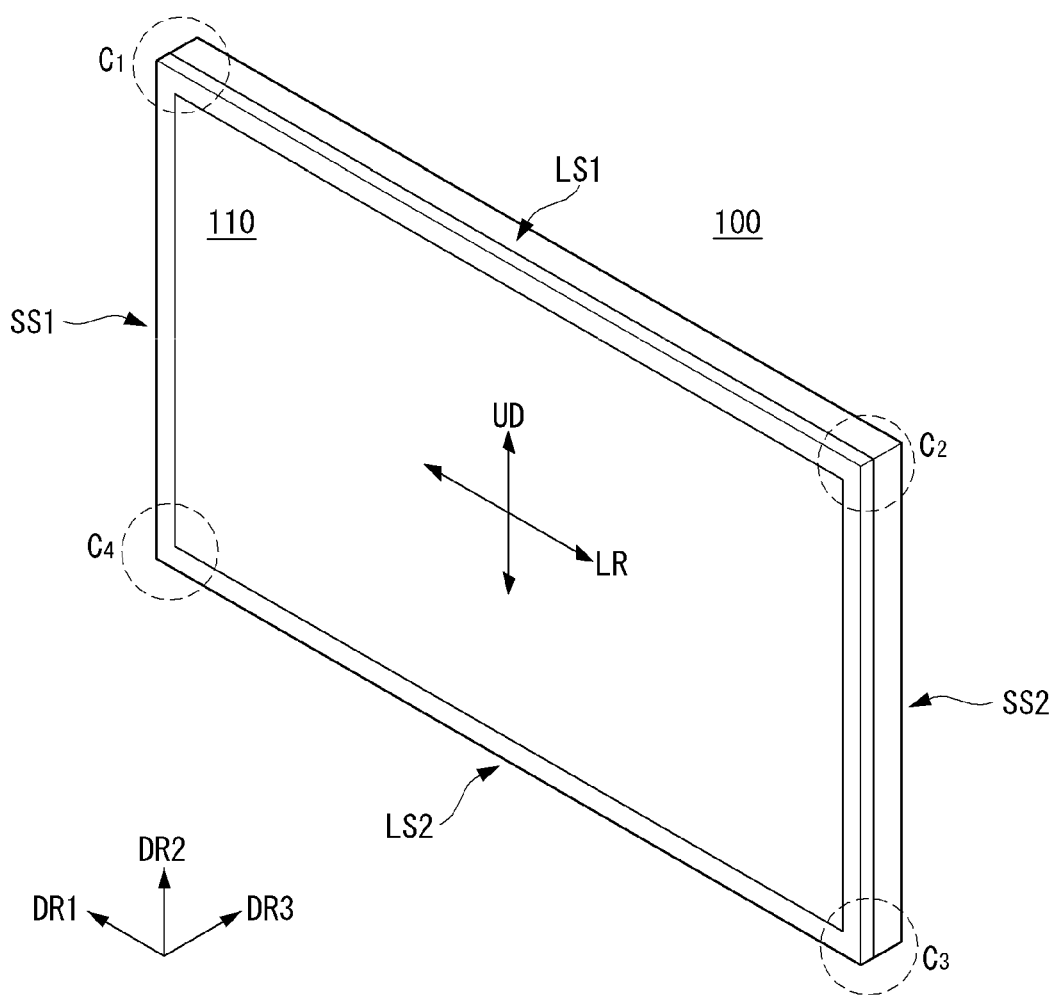
【FIG. 1】

[FIG. 2]
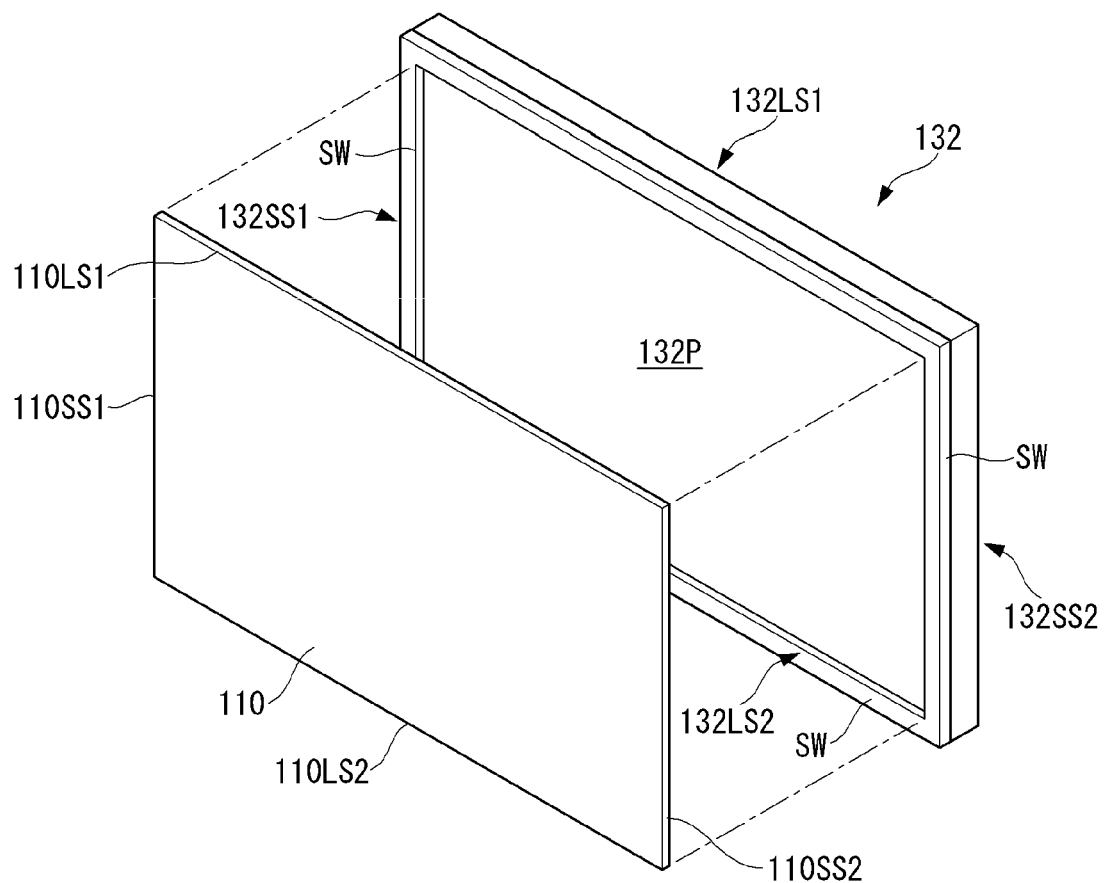

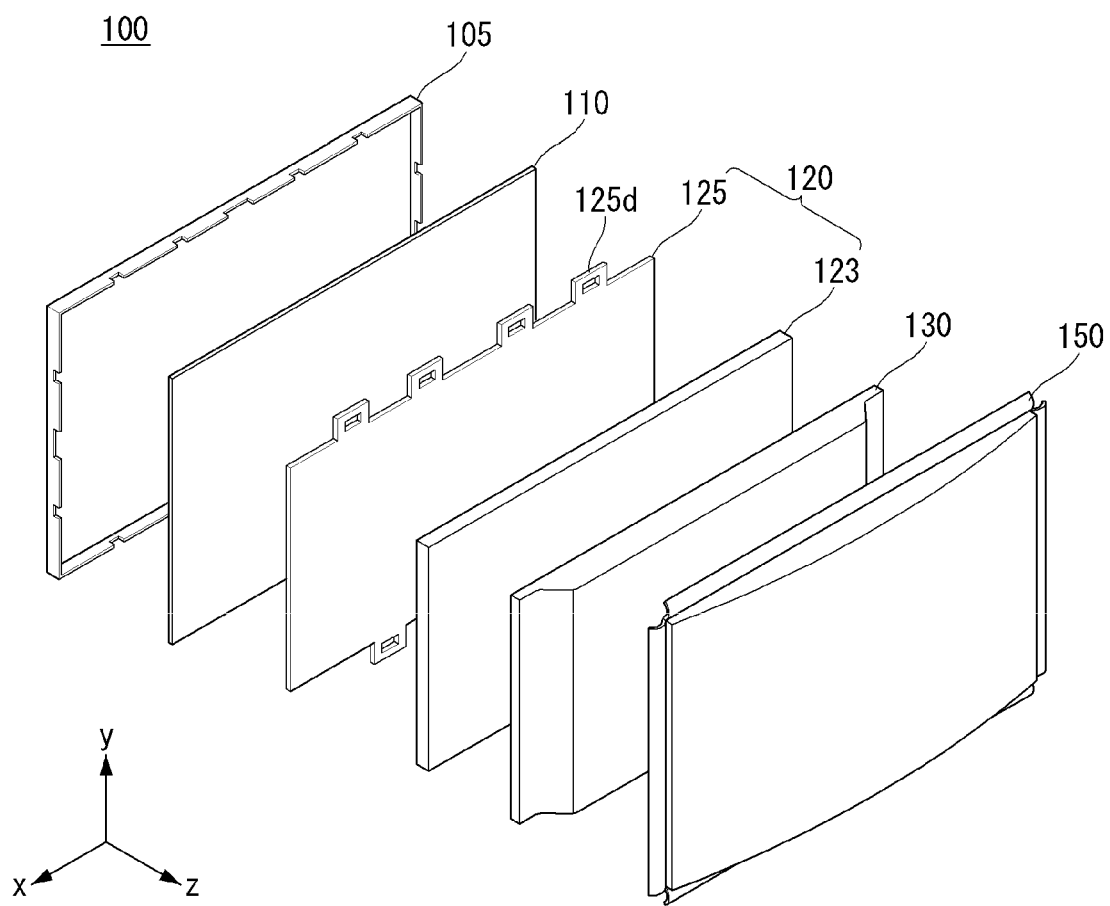
[FIG. 3]

[FIG. 4]
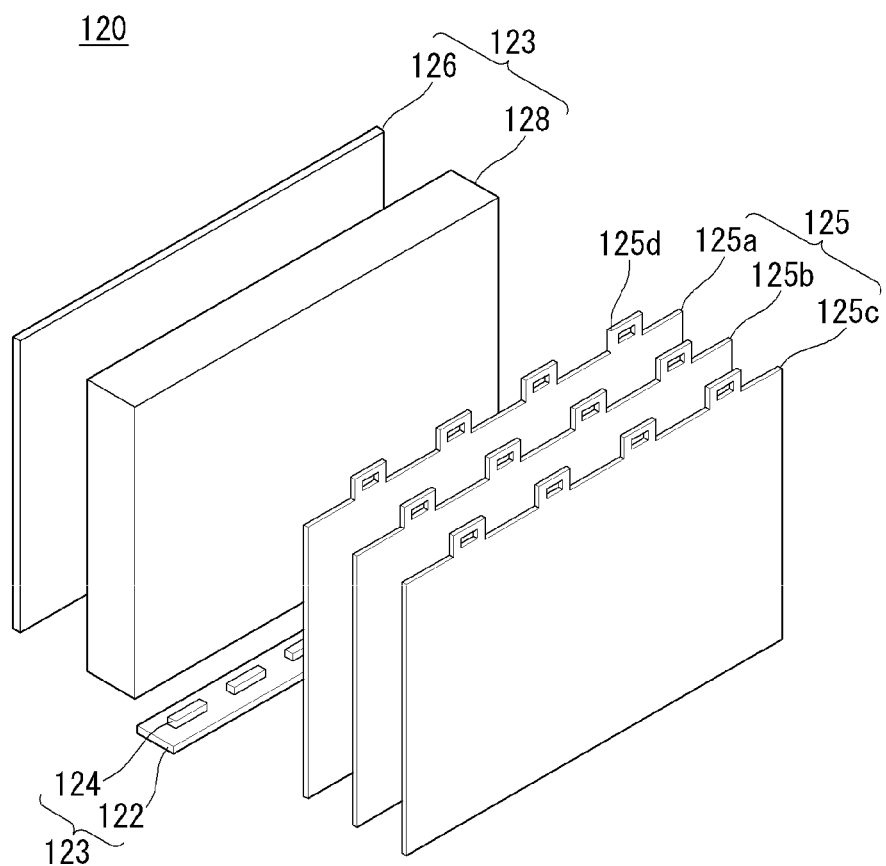

[FIG. 5]
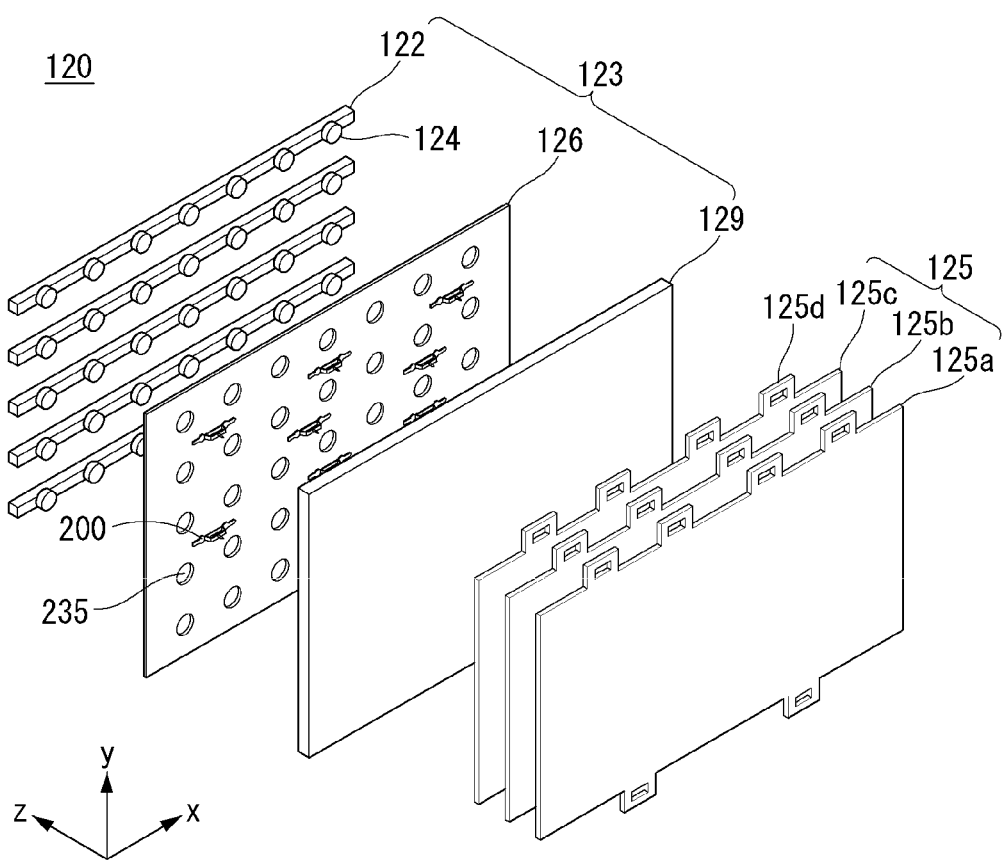

[FIG. 6]
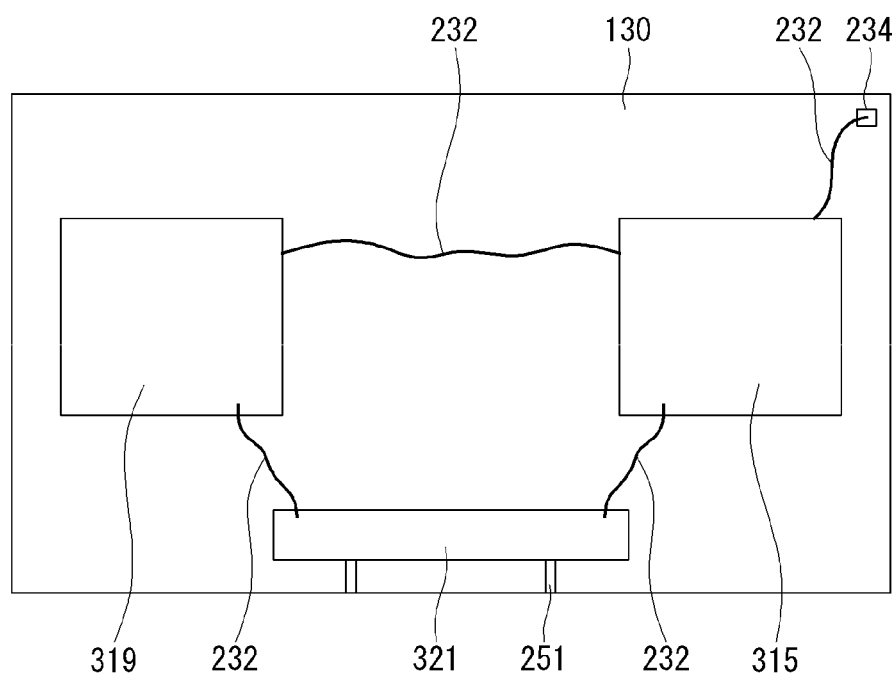

[FIG. 7]
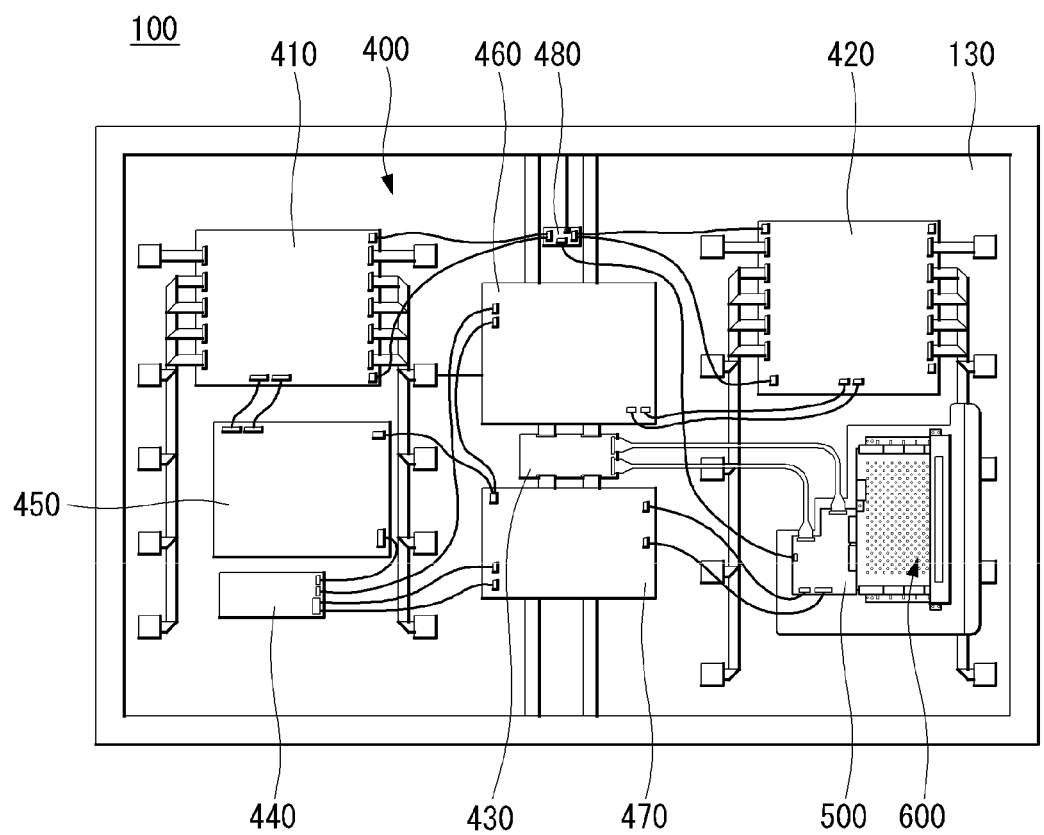

【FIG. 8】
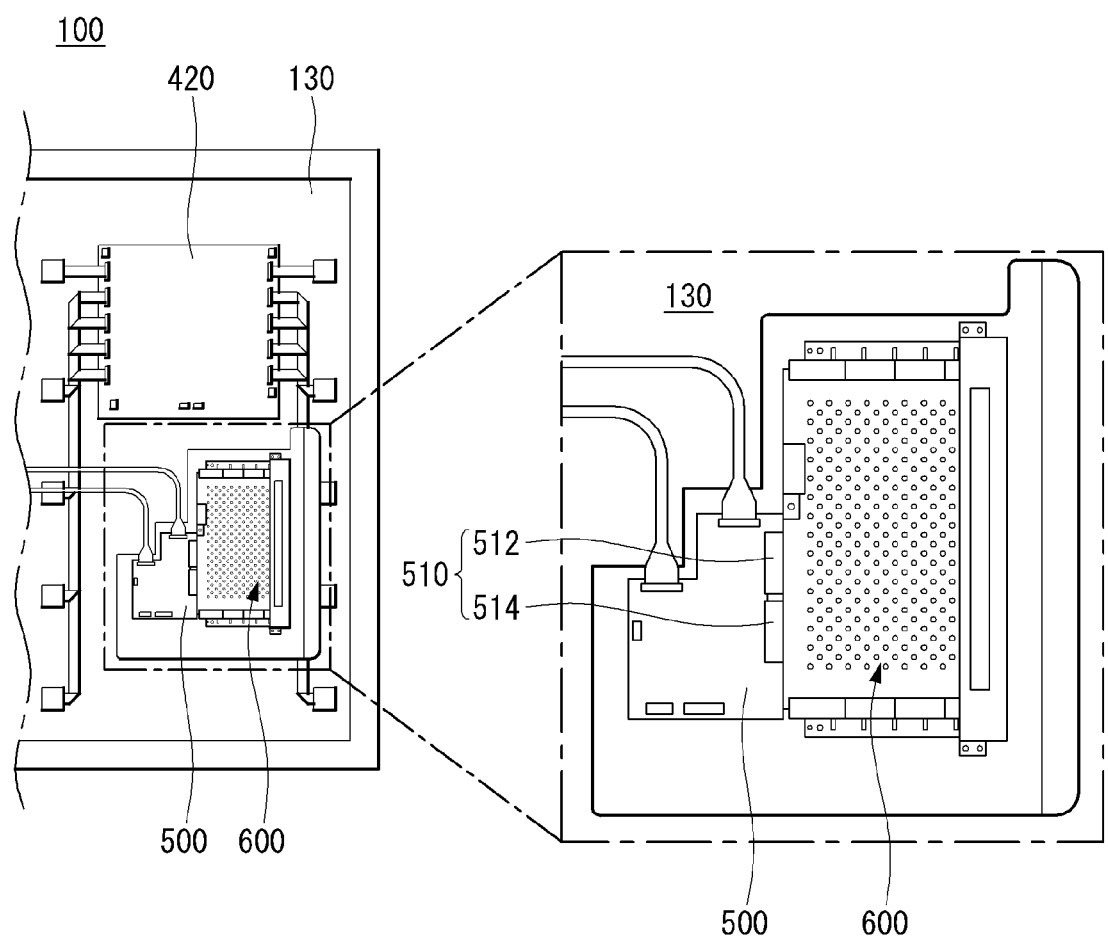

[FIG. 9]
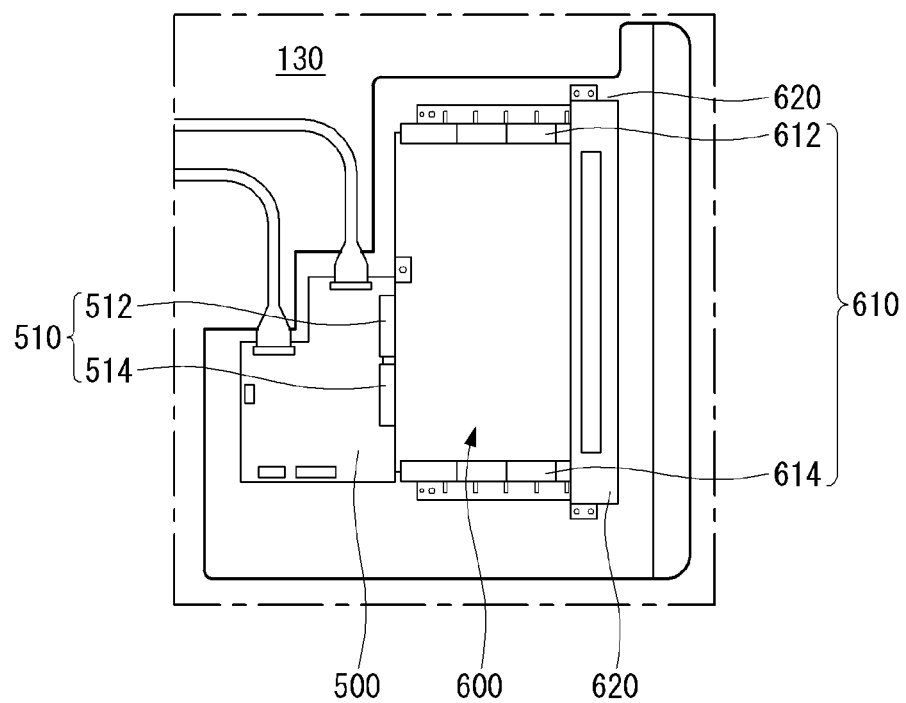

【FIG. 10】
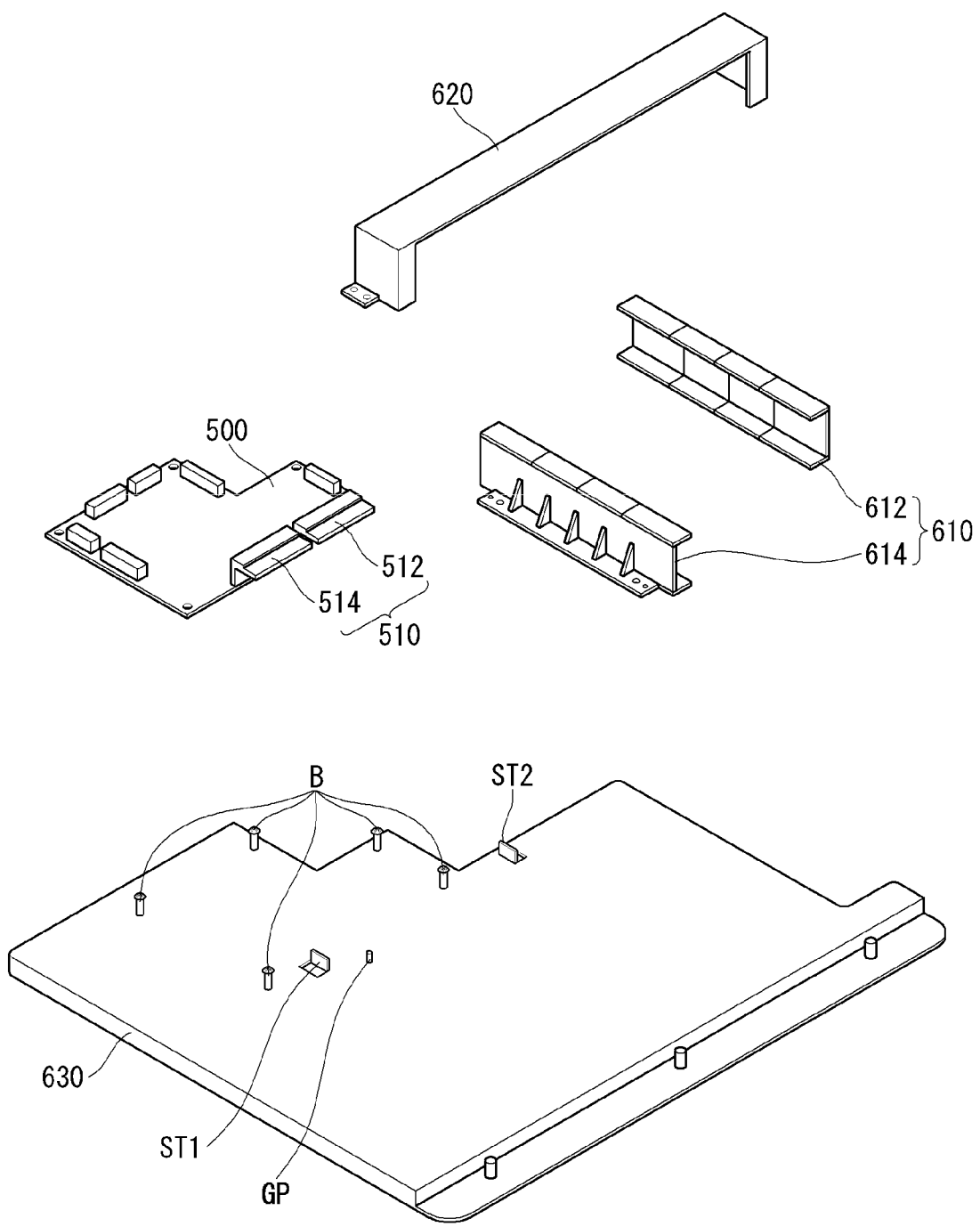

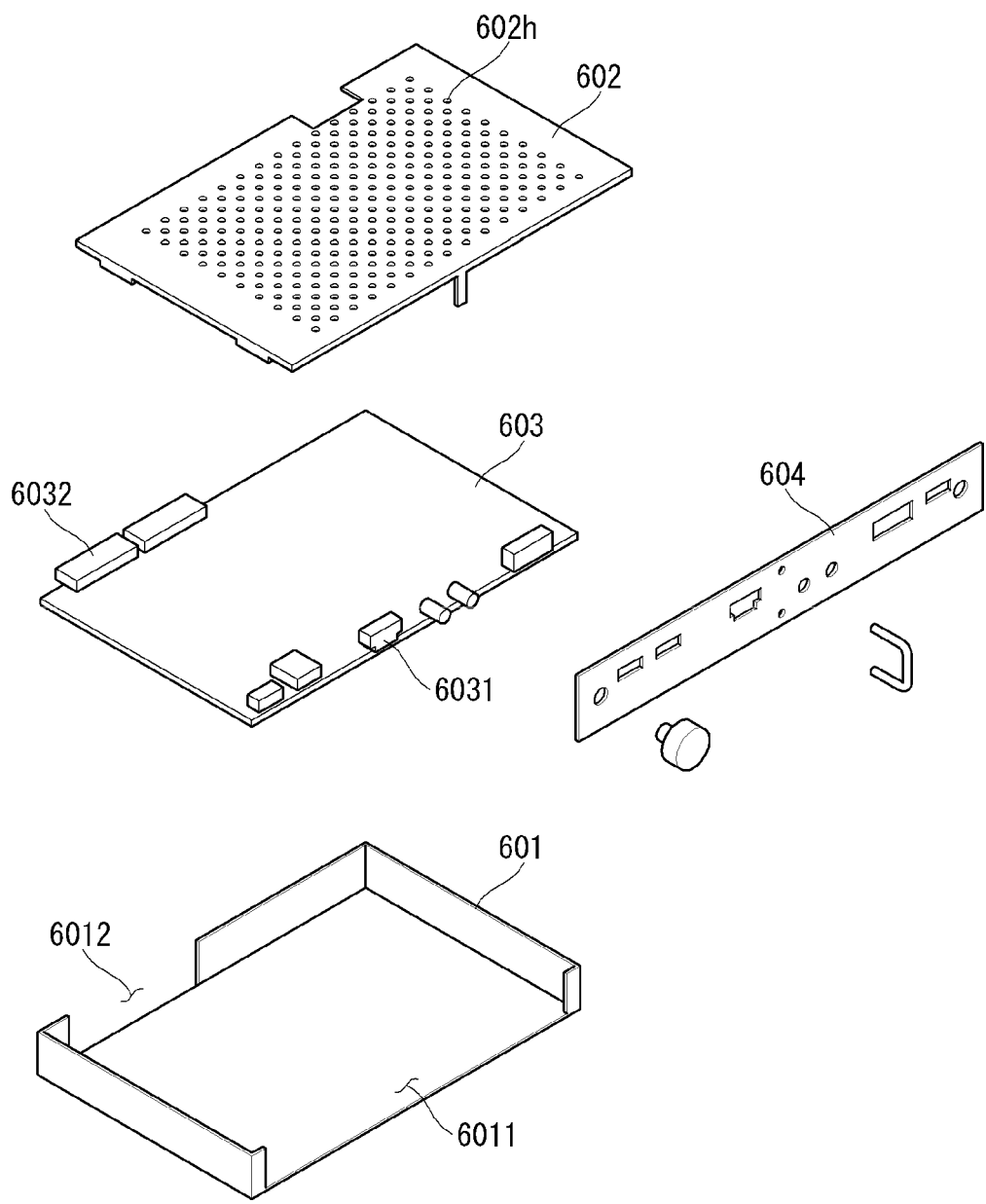
[FIG. 11]

【FIG. 12】
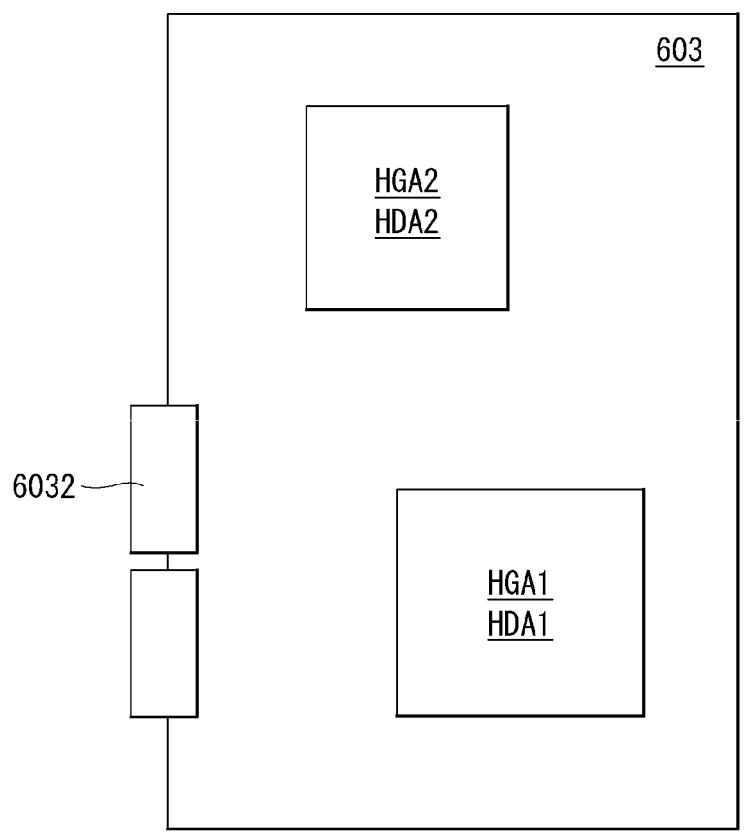

【FIG. 13】
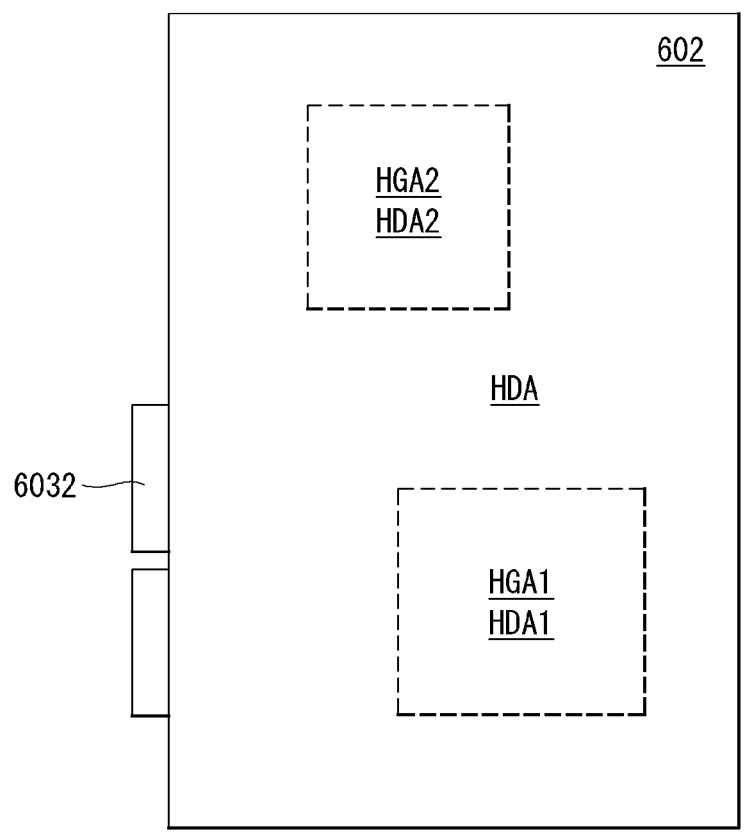

【FIG. 14】
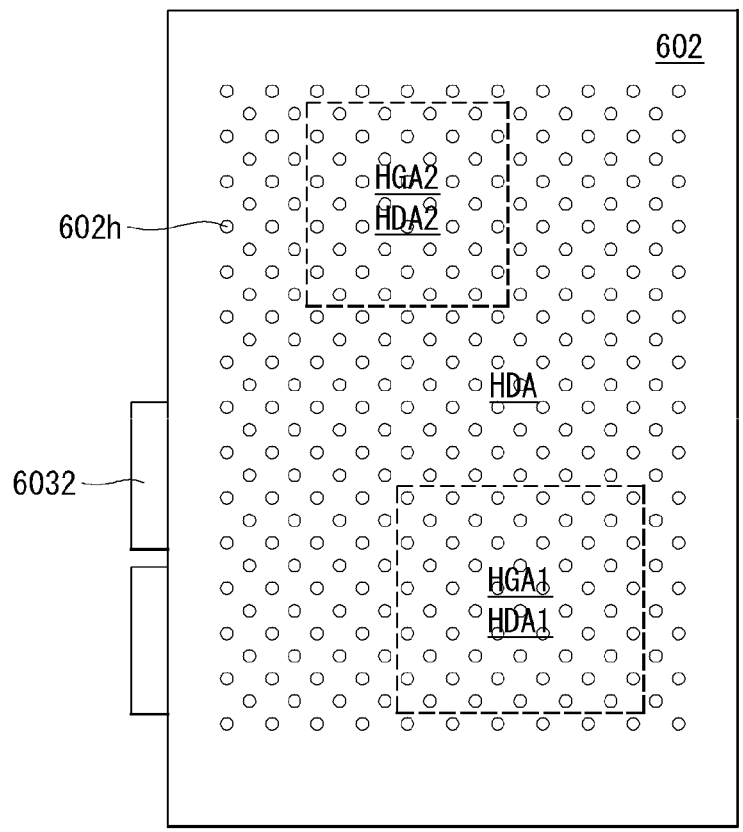
【FIG. 15】
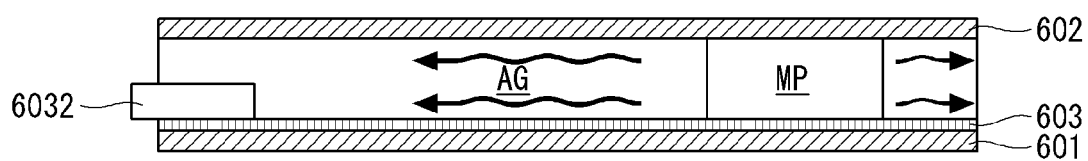

[FIG. 16]
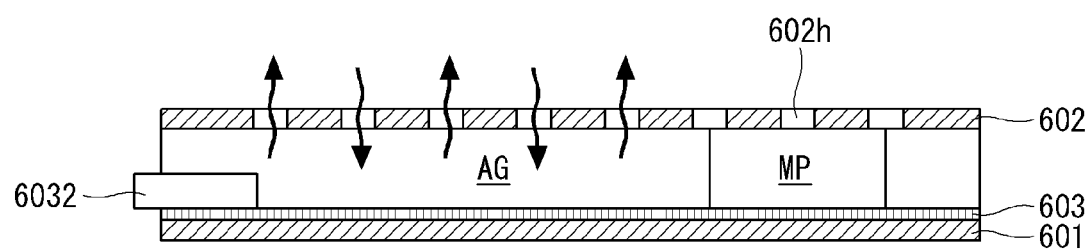
[FIG. 17]
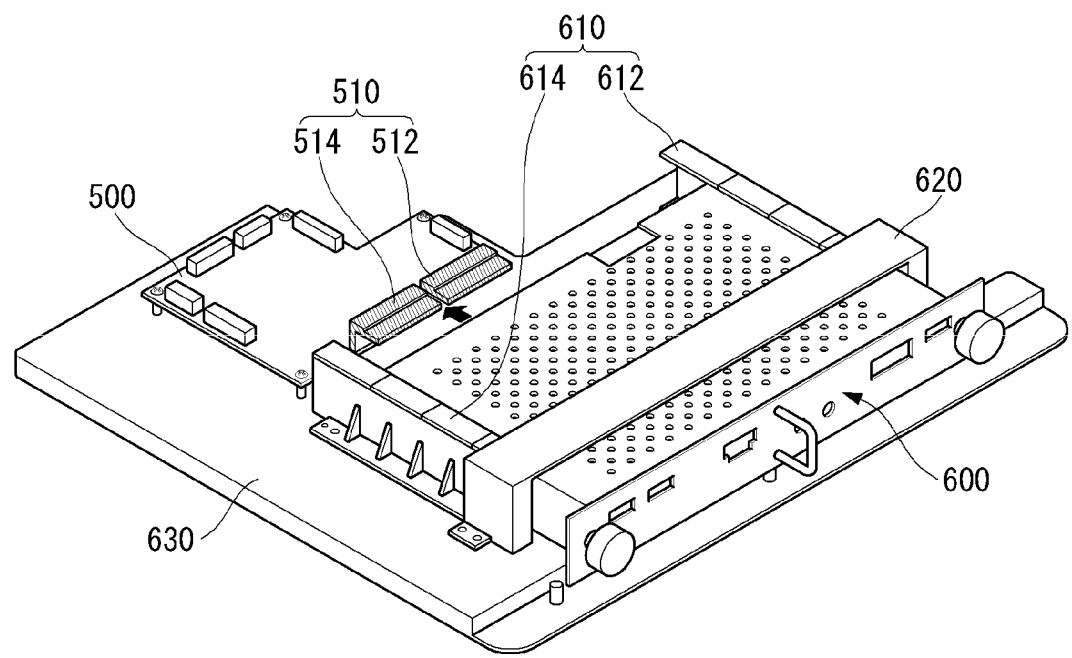

【FIG. 18】
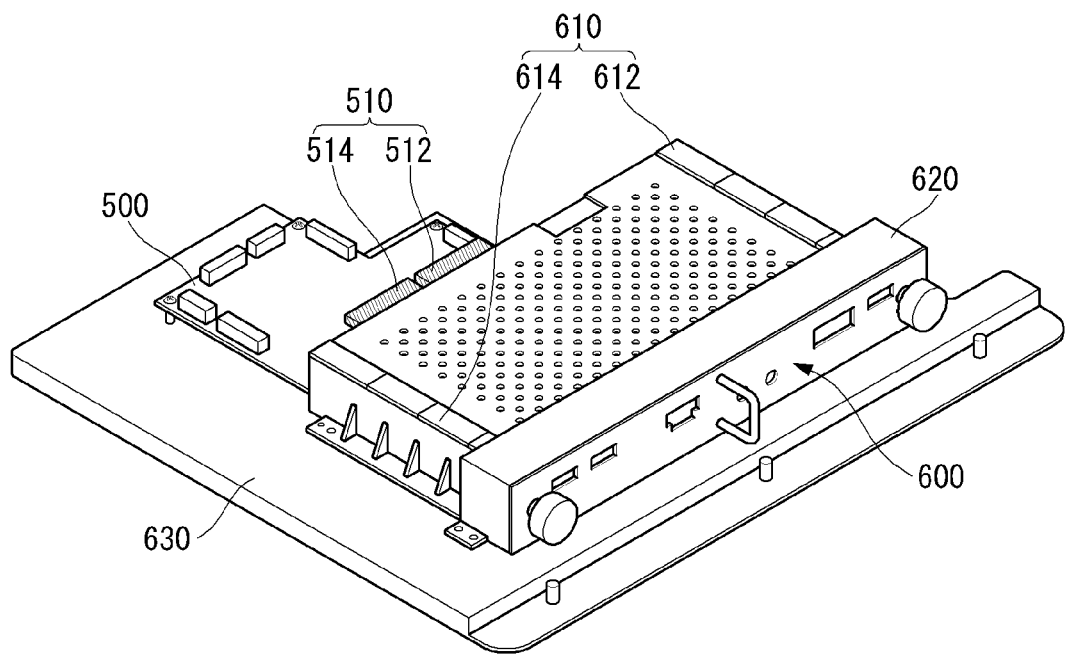
【FIG. 19】
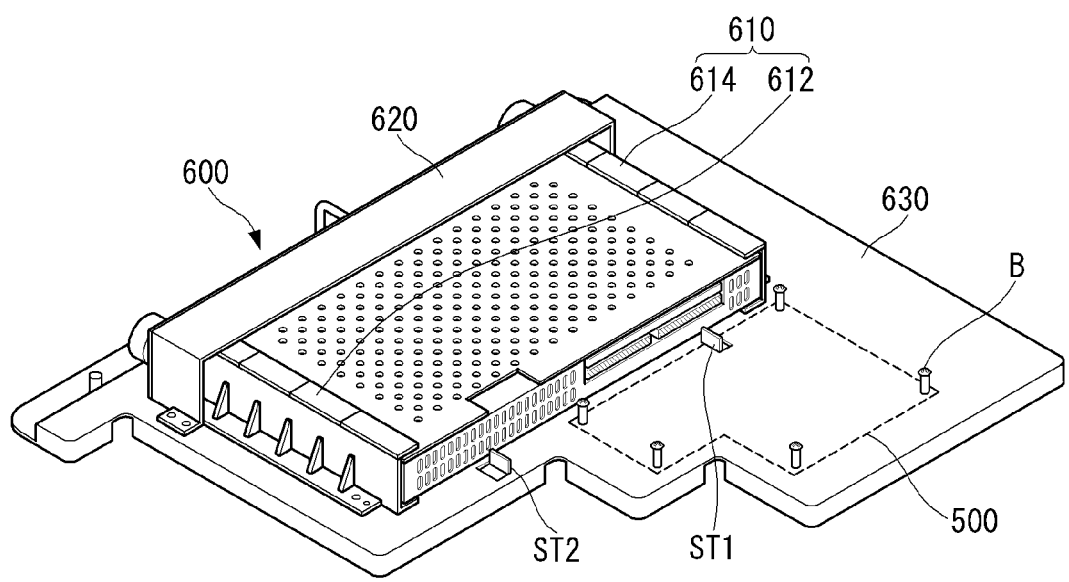

[FIG. 20]
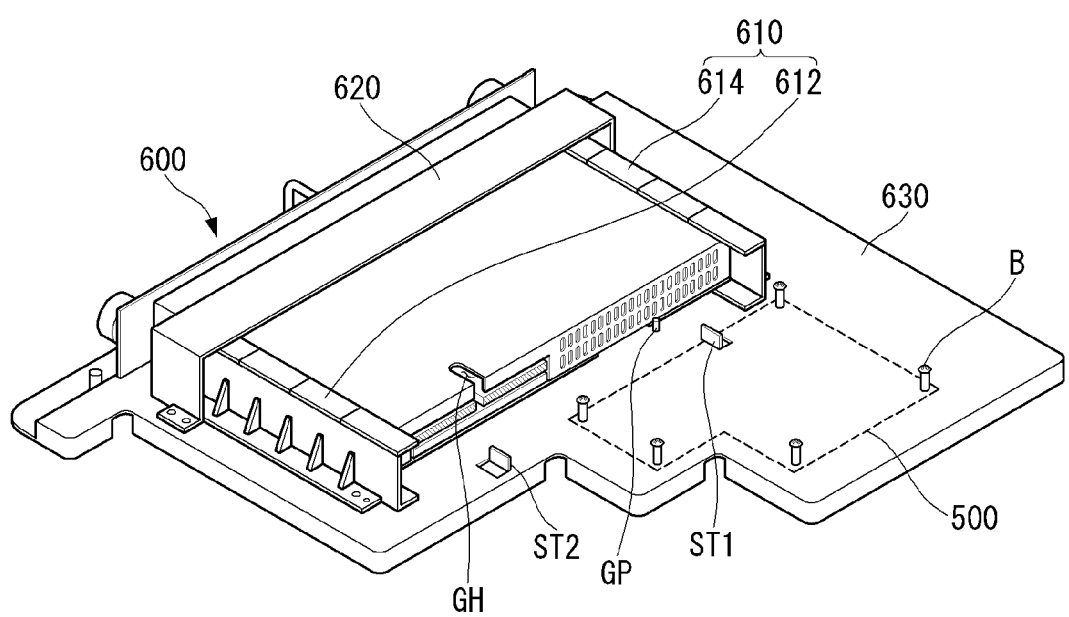

[FIG. 21]
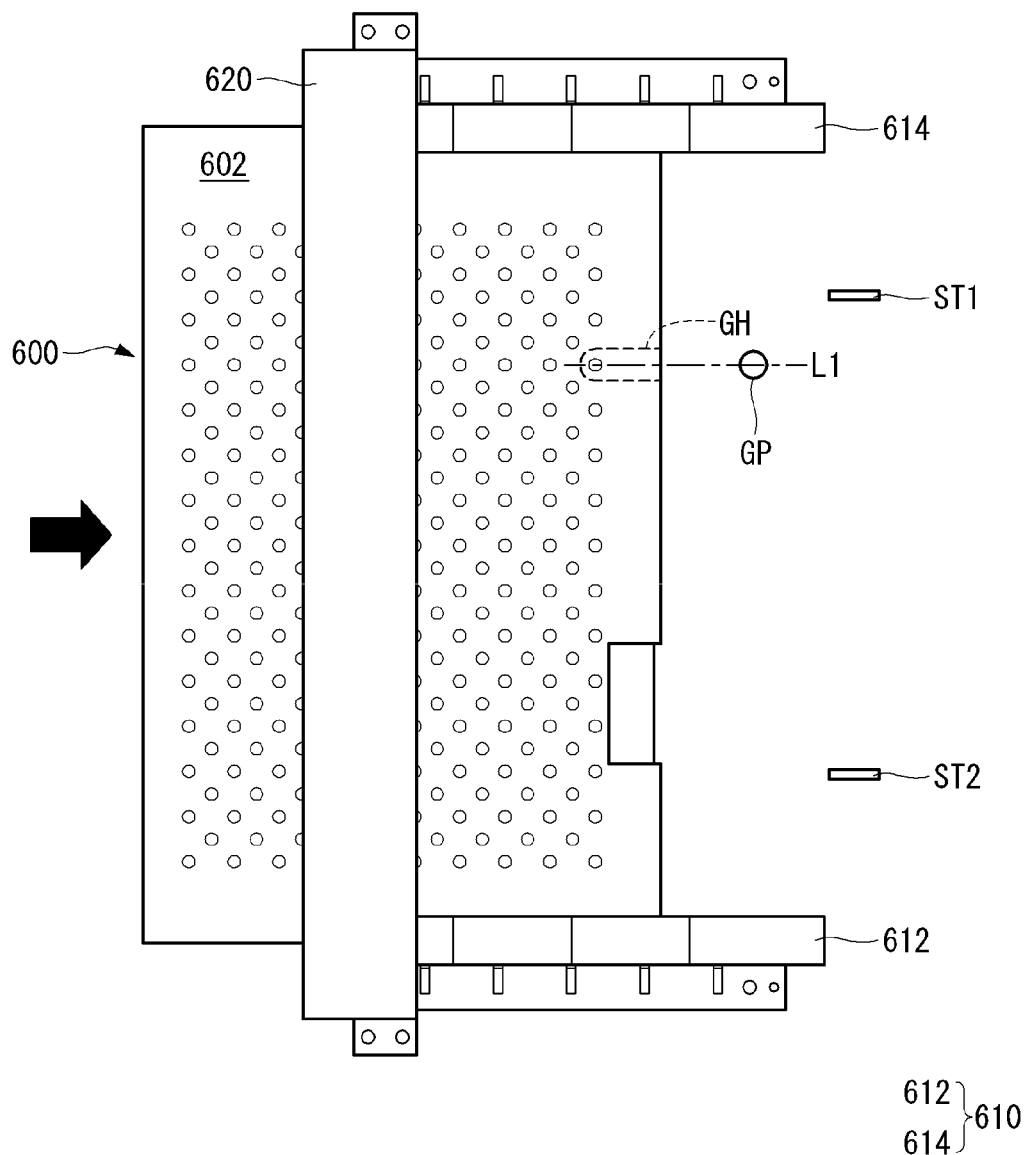

【FIG. 22】
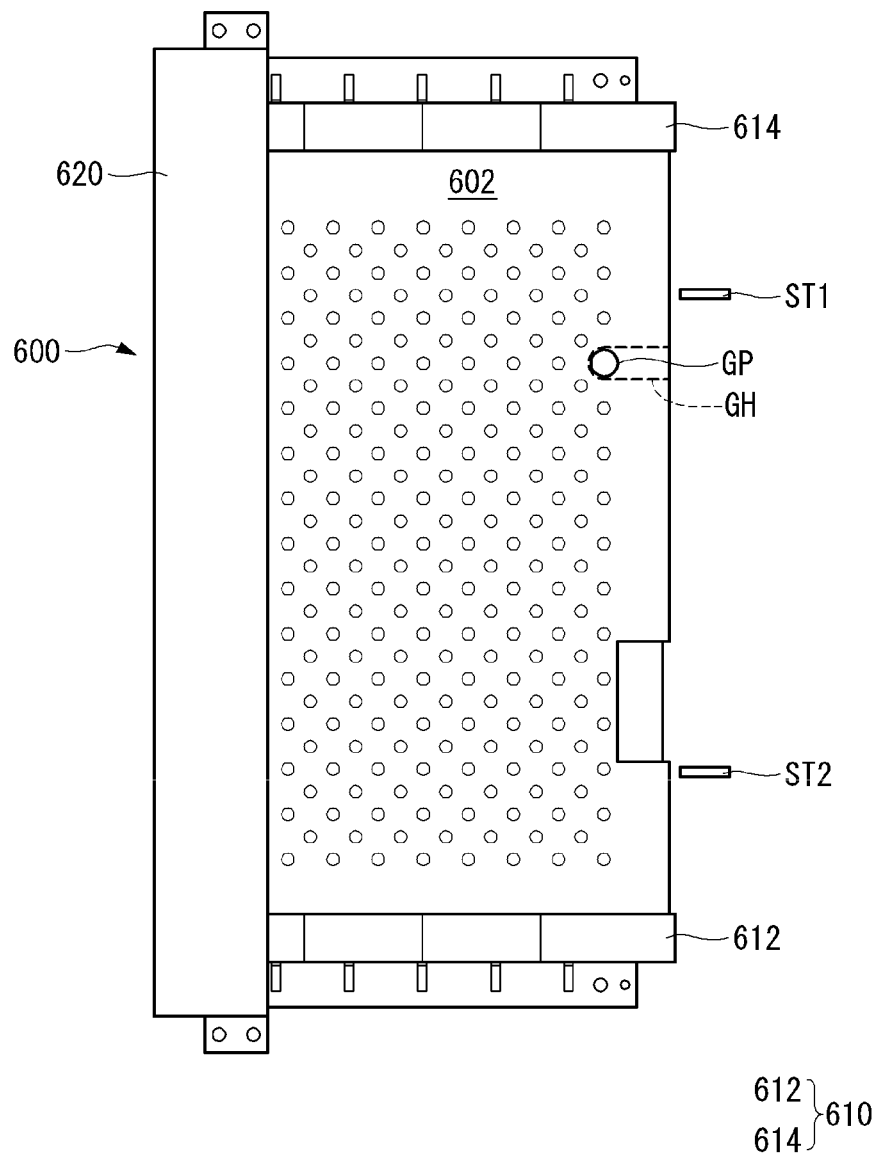

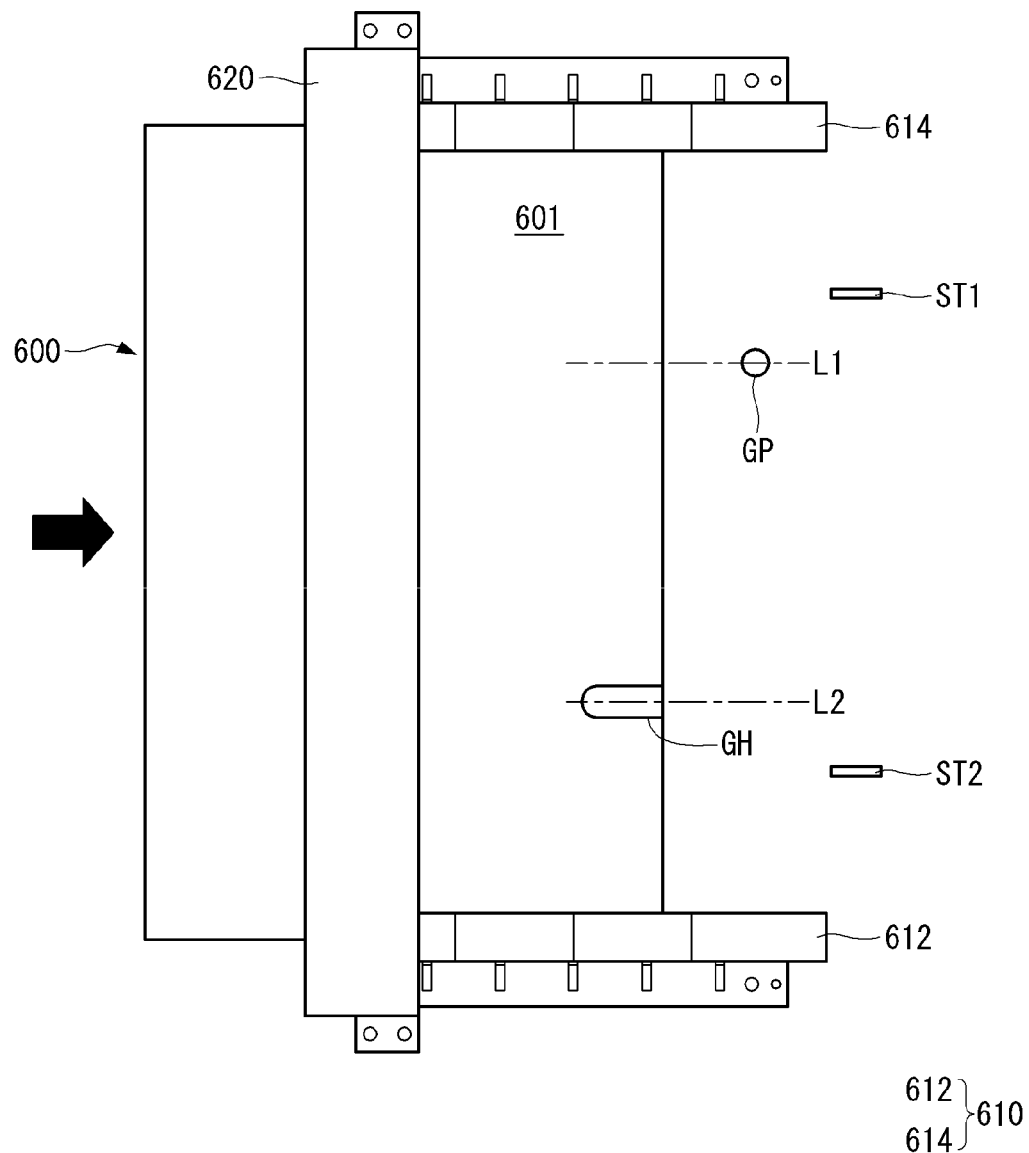
[FIG. 23]

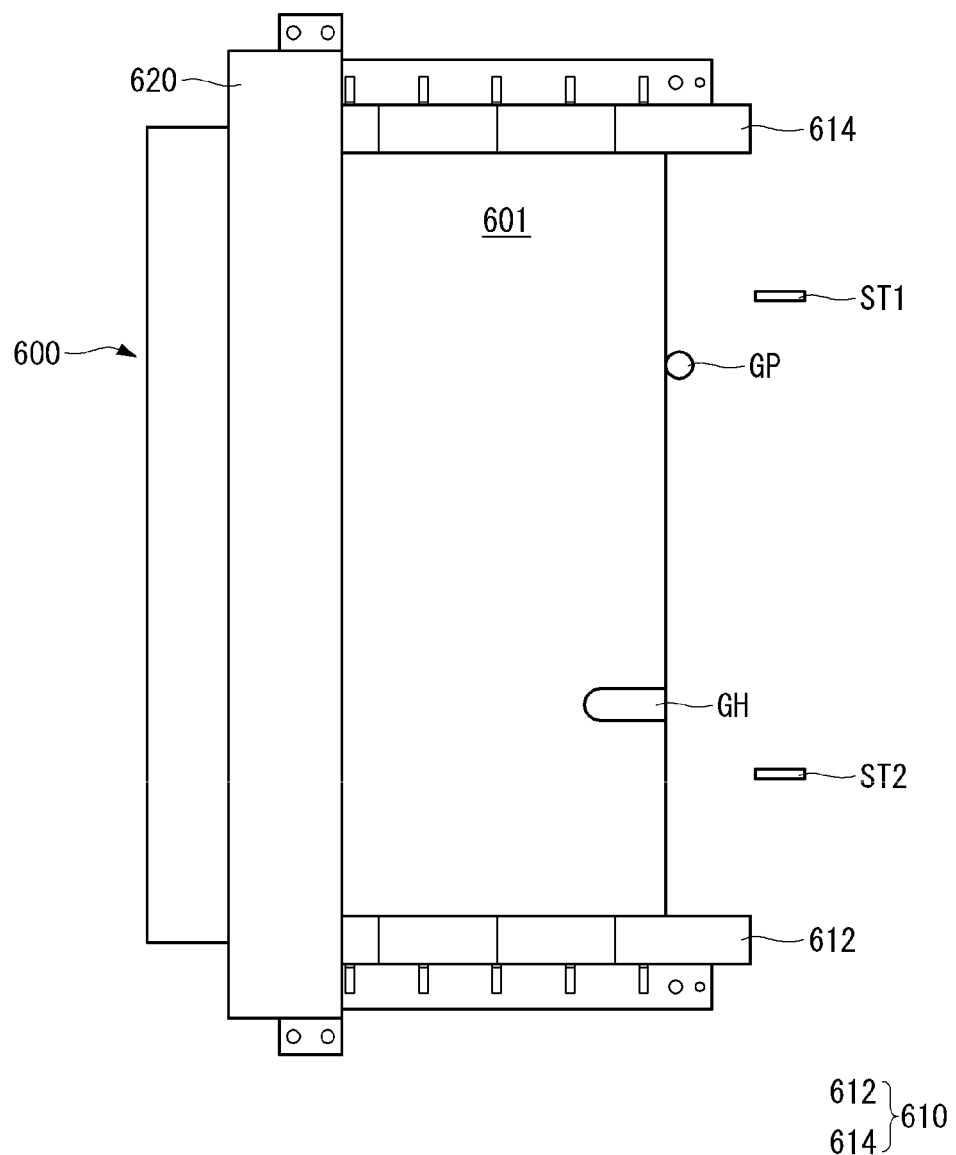
[FIG. 24]

[FIG. 25]
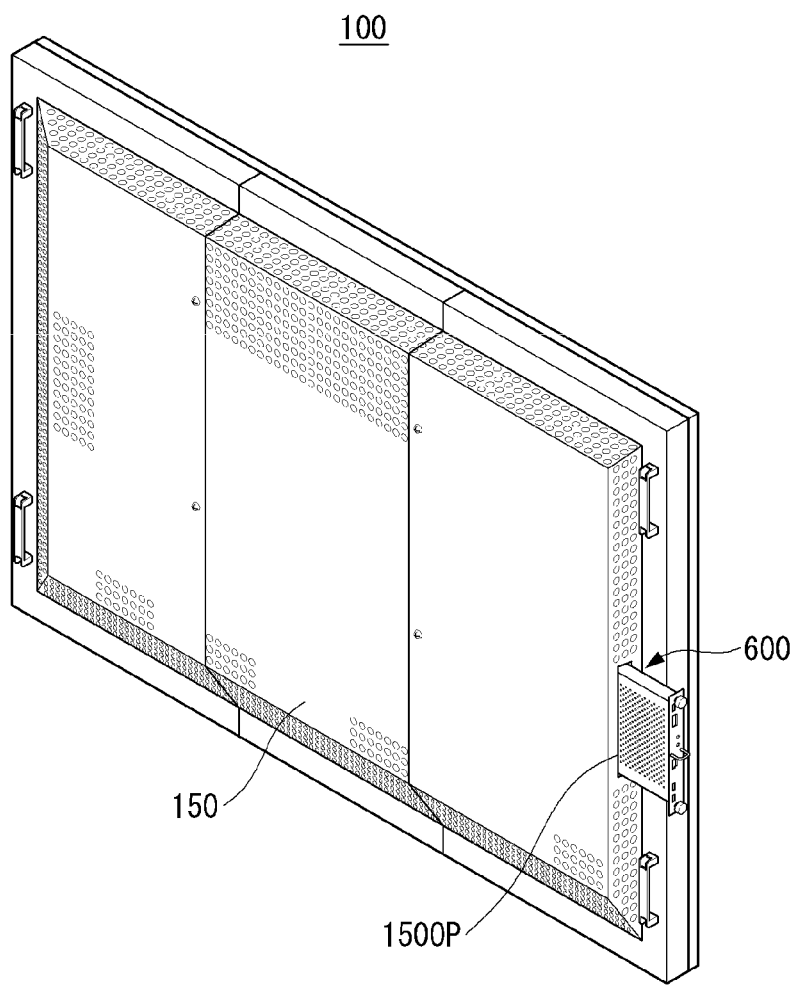

DISPLAY DEVICE

CROSS-REFERENCE TO RELATED APPLICATIONS

This application is the National Stage filing under 35 U.S.C. 371 of International Application No. PCT/KR2016/006177, filed on Jun. 10, 2016, the contents of which are hereby incorporated by reference herein its entirety.

TECHNICAL FIELD

The present disclosure relates to a display device.

BACKGROUND ART

With the development of the information society, various demands for display devices are increasing. Various display devices, such as liquid crystal displays (LCDs), plasma display panels (PDPs), electroluminescent displays (ELDs), vacuum fluorescent displays (VFDs), and organic light emitting diode (OLED) displays, have been recently studied and used in response to various demands for the display devices.

An OLED panel can display an image by depositing an organic layer, that is able to emit light by itself, on a substrate on which transparent electrodes are formed. The OLED panel may have a thin profile and flexible characteristics.

A liquid crystal panel of the LCD includes a liquid crystal layer and a TFT substrate and a color filter substrate that are positioned opposite each other with the liquid crystal layer interposed therebetween. The liquid crystal panel can display an image using light provided by a backlight unit.

Display devices that are remotely controlled, are installed in a public place or a commercial space, and display information, entertainment, advertisements, etc., have been recently widely used. The display devices may be installed in an outdoor place such as an outer wall of a building and a display board, or in an indoor place such as an inner wall of a large shopping mall, a subway, and a bus stop. The display device may become larger, and thus many studies have been made on structural characteristics according to the large-sized display device.

DISCLOSURE

Technical Problem

An object of the present disclosure is to address the above-described and other problems. Another object of the present disclosure is to improve heat dissipation efficiency of a control module.

Another object of the present disclosure is to facilitate replacement of a control module.

Technical Solution

In order to achieve the above-described and other objects, in one aspect of the present disclosure, there is provided a display device comprising a display panel; a frame positioned in a rear of the display panel; a back cover positioned in a rear of the frame; a controller installed between the frame and the back cover; a control module movable between the frame and the back cover; and a bridge unit installed between the frame and the back cover, electrically connected to the controller, and electrically connected to the control module when the control module is inserted between the frame and the back cover.

According to another aspect of the present disclosure, the display device may further comprise a slot installed in the frame, the control module being insertable into the slot; and a rail positioned between the slot and the bridge unit and extended so that one end of the rail is adjacent to a portion of the slot and the other end is adjacent to the bridge unit, wherein the control module slides on the rail.

According to another aspect of the present disclosure, the display device may further comprise a stopper formed between the slot and the bridge unit and adjacent to the bridge unit, the stopper protruding from the frame toward the back cover.

According to another aspect of the present disclosure, the display device may further comprise a guide protrusion formed between the slot and the stopper and adjacent to the stopper, the guide protrusion protruding from the frame toward the back cover; and a guide groove formed on one surface of the control module, the guide protrusion being inserted into the guide groove, wherein the guide protrusion and the guide groove may be positioned on the same straight line extended in an insertion direction of the control module.

According to another aspect of the present disclosure, the rail may include a first rail positioned on one side of the control module; and a second rail positioned on the other side of the control module, wherein the guide groove and the guide protrusion may be adjacent to one of the first rail or the second rail.

According to another aspect of the present disclosure, the control module may include a first case providing an internal accommodation space; a second case covering the first case; and a main board embedded in the first case, at least a portion of the main board being in contact with the second case.

According to another aspect of the present disclosure, the second case may include a plurality of holes.

According to another aspect of the present disclosure, the control module may be inserted inside the back cover from an outside surface of the back cover.

According to another aspect of the present disclosure, the controller and the bridge unit may be fixed to a rear surface of the frame. The control module may electrically contact the bridge unit, and a portion of the control module may be exposed to an outside of the display device.

According to another aspect of the present disclosure, the control module may include a first connector exposed to one side of the back cover; and a second connector electrically connected to the bridge unit.

Advantageous Effects

According to at least one aspect of the present disclosure, the present disclosure can improve heat dissipation efficiency of a control module.

According to at least one aspect of the present disclosure, the present disclosure can facilitate replacement of a control module.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DESCRIPTION OF DRAWINGS

FIGS. 1 to 6 illustrate configuration of a display device related to the present disclosure.

FIGS. 7 to 9 illustrate examples of a controller of a display device according to an embodiment of the disclosure.

FIGS. 10 and 11 illustrate examples of a control module according to an embodiment of the disclosure.

FIGS. 12 to 16 illustrate examples of heat dissipation of a control module according to an embodiment of the disclosure.

FIGS. 17 to 25 illustrate examples of attaching and detaching a control module according to an embodiment of the disclosure.

MODE FOR INVENTION

Reference will now be made in detail to embodiments of the disclosure, examples of which are illustrated in the accompanying drawings. Wherever possible, the same reference numbers will be used throughout the drawings to refer to the same or like parts.

In general, a suffix such as "module" and "unit" may be used to refer to elements or components. Use of such a suffix herein is merely intended to facilitate description of the specification, and the suffix itself is not intended to give any special meaning or function.

It will be noted that a detailed description of known arts will be omitted if it is determined that the detailed description of the known arts can obscure the embodiments of the disclosure.

The accompanying drawings are used to help easily understand various technical features, and it should be understood that the embodiments presented herein are not limited by the accompanying drawings. As such, the present disclosure should be construed to extend to any alterations, equivalents and substitutes in addition to those which are particularly set out in the accompanying drawings.

A display panel may use an organic light emitting diode (OLED) panel, a plasma display panel (PDP), a field emission display (FED) panel, and a liquid crystal display (LCD) panel.

In the following description, a display device may include a first long side LS1, a second long side LS2 opposite the first long side LS1, a first short side SS1 adjacent to one end of each of the first long side LS1 and the second long side LS2, and a second short side SS2 opposite the first short side SS1.

In embodiments disclosed herein, the first short side SS1 may be referred to as a first side area, the second short side SS2 may be referred to as a second side area opposite the first side area, the first long side LS1 may be referred to as a third side area which is adjacent to the first side area and the second side area and is positioned between the first side area and the second side area, and the second long side LS2 may be referred to as a fourth side area which is adjacent to the first side area and the second side area, is positioned between the first side area and the second side area, and is opposite to the third side area.

Embodiments of the disclosure describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device.

A third direction DR3 may be a direction vertical to the first direction DR1 and/or the second direction DR2.

The first direction DR1 and the second direction DR2 may be commonly referred to as a horizontal direction. Further, the third direction DR3 may be referred to as a vertical direction.

From another point of view, a side of the display device on which an image is displayed may be called a forward direction or a front side or a front surface. When the display device displays an image, a side at which the image cannot be observed may be called a rearward direction or rear side or a rear surface. When the display device is viewed from the forward direction or the front surface, the first long side LS1 may be called an upper side or an upper surface. In the same manner, the second long side LS2 may be called a lower side or a lower surface. In the same manner, the first short side SS1 may be called a left side or a left surface, and the second short side SS2 may be called a right side or a right surface.

Further, the first long side LS1, the second long side LS2, the first short side SS1, and the second short side SS2 may be referred to as edges of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1, a position where the first long side LS1 and the second short side SS2 meet each other may be referred to as a second corner C2, a position where the second short side SS2 and the second long side LS2 meet each other may be referred to as a third corner C3, and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

FIGS. 1 to 6 illustrate a display device related to the present disclosure.

Referring to FIG. 1, one surface of a display panel 110 may be observed in front of a display device 100. The one surface of the display panel 110 may display an image. The display panel 110 may be divided into an active area AA on which the image is displayed, and a de-active area DA on which the image is not displayed. A bezel may be positioned at an edge of a front surface of the display device 100 and may include the de-active area DA.

Referring to FIG. 2, a module cover 132 may include a plate portion 132P and a side wall SW. The module cover 132 may support the display panel 110. To this end, the module cover 132 may include a metal material.

The module cover 132 may include a slim metal or an ultra slim metal. Thus, the plate portion 132P may include a metal material and may include a slim metal or an ultra slim metal.

The side wall SW may be positioned at an edge of the plate portion 132P. The side wall SW may be formed as one body with the plate portion 132P, or formed separately from the plate portion 132P, or coupled to the plate portion 132P. The side wall SW may have a thickness greater than a thickness of the plate portion 132P, or the same thickness as the plate portion 132P. The module cover 132 may include the plate portion 132P and the side wall SW through the pressing.

An area of the plate portion 132P may correspond to an area of the display panel 110. The side wall SW may be positioned on a first long side 132LS1, a second long side 132LS2, a first short side 132SS1, or a second short side 132SS2 of the module cover 132.

The display panel 110 may be positioned at a front surface of the plate portion 132P. The display panel 110 may be flexible, and thus the module cover 132 may provide predetermined rigidity for the display panel 110 positioned at the front surface of the plate portion 132P.

A length of a first long side 110LS1 of the display panel 110 may be slightly shorter than a length of the first long side 132LS1 of the module cover 132. A length of a first short side 110SS1 of the display panel 110 may be slightly shorter than a length of the first short side 132SS1 of the module cover 132. The display panel 110 may be attached to the plate portion 132P or fitted in the module cover 132.

The display panel 110 may be provided in front of the display device 100 and may display an image. The display panel 110 may divide an image into a plurality of pixels and may output the image while controlling color, brightness, and chroma of each pixel. The display panel 110 may be divided into an active area AA on which an image is displayed, and a de-active area DA on which the image is not displayed. The display panel 110 may generate light corresponding to red, green, or blue color in response to a control signal.

As shown in FIG. 3, the display device 100 according to the present disclosure may include a front cover 105, the display panel 110, a backlight unit 120, a frame 130, and a back cover 150.

The front cover 105 may cover at least a portion of a front surface and a side surface of the display panel 110. The front cover 105 may have a rectangular frame shape, in which a center portion is empty. Because the center portion of the front cover 105 is empty, an image on the display panel 110 may be displayed to the outside.

The front cover 105 may be divided into a front part and a side part. Namely, the front cover 105 may include the front part positioned at the front surface of the display panel 110 and the side part positioned at the side surface of the display panel 110. The front part and the side part may be separately configured. One of the front part and the side part may be omitted. For example, for the purpose of a beautiful design, the front part may be omitted and only the side part may be present.

The display panel 110 may be provided in front of the display device 100 and may display an image. The display panel 110 may divide an image into a plurality of pixels and may output the image while controlling color, brightness, and chroma of each pixel. The display panel 110 may be divided into an active area on which the image is displayed, and a de-active area on which the image is not displayed. The display panel 110 may include a front substrate and a rear substrate that are positioned opposite each other with a liquid crystal layer interposed therebetween.

The front substrate may include a plurality of pixels each including red (R), green (G), and blue (B) subpixels. The front substrate may generate an image corresponding to red, green, or blue color in response to a control signal.

The rear substrate may include switching elements. The rear substrate may switches on or off pixel electrodes. For example, the pixel electrodes may change a molecule arrangement of the liquid crystal layer in response to a control signal received from the outside. The liquid crystal layer may include a plurality of liquid crystal molecules. The arrangement of the liquid crystal molecules may be changed depending on a voltage difference between the pixel electrode and a common electrode. The liquid crystal layer may transmit light provided by the backlight unit 120 to the front substrate.

The backlight unit 120 may be positioned in the rear of the display panel 110. The backlight unit 120 may include a plurality of light sources. The light sources of the backlight unit 120 may be arranged in an edge type or a direct type. In case of the direct type backlight unit 120, a diffusion plate may be further included.

The backlight unit 120 may be coupled to a front surface of the frame 130. For example, the plurality of light sources may be disposed inside the frame 130. In this case, the backlight unit 120 may be commonly called the edge type backlight unit 120.

The backlight unit 120 may be driven in an entire driving method or a partial driving method, such as a local dimming method and an impulsive driving method. The backlight unit 120 may include an optical sheet 125 and an optical layer 123.

The optical sheet 125 may enable light of the light sources to be uniformly transmitted to the display panel 110. The optical sheet 125 may include a plurality of layers. For example, the optical sheet 125 may include at least one prism sheet and/or at least one diffusion sheet.

At least one coupling portion 125d may be present in the optical sheet 125. The coupling portion 125d may be coupled to the front cover 105 and/or the back cover 150. Namely, the coupling portion 125d may be directly coupled to the front cover 105 and/or the back cover 150. Alternatively, the coupling portion 125d may be coupled to a structure coupled on the front cover 105 and/or the back cover 150. Namely, the coupling portion 125d may be indirectly coupled to the front cover 105 and/or the back cover 150. The coupling portion 125d may be fixed to the frame 130.

The frame 130 may function to support components constituting the display device 100. For example, configuration such as the backlight unit 120 may be coupled to the frame 130. The frame 130 may be formed of a metal material, for example, an aluminum alloy.

The back cover 150 may form a rear surface of the display device 100. The back cover 150 may protect an internal configuration of the display device 100 from the outside. At least a portion of the back cover 150 may be coupled to the frame 130 and/or the front cover 105. The back cover 150 may be an injection of a resin material.

Referring to FIG. 4, the backlight unit 120 may include the optical layer 123 including a substrate 122, at least one light assembly 124, a reflective sheet 126, and a light guide plate 128, and the optical sheet 125 positioned at a front surface of the optical layer 123.

The substrate 122 may be positioned on at least one side of the optical layer 123. The substrate 122 may be extended along the optical layer 123.

At least one light assembly 124 may be mounted on the substrate 122. The substrate 122 may have an electrode pattern for connecting an adaptor to the light assembly 124.

For example, a carbon nanotube electrode pattern for connecting the adaptor to the light assembly 124 may be formed on the substrate 122.

The substrate 122 may be formed of at least one of polyethylene terephthalate (PET), glass, polycarbonate (PC), and silicon. The substrate 122 may be a printed circuit board (PCB) on which at least one light assembly 124 is mounted.

The light assembly 124 may be disposed on the substrate 122 at predetermined intervals. A size of the light assembly 124 may be less than a thickness of the light guide plate 128. Thus, most of light emitted from the light assembly 124 may be transferred to the inside of the light guide plate 128.

The light assembly 124 may be a light emitting diode (LED) chip or a LED package including at least one LED chip.

The light assembly 124 may be configured as a colored LED emitting at least one of red, green, and blue light or a white LED. The colored LED may include at least one of a red LED, a green LED, and a blue LED.

A light source included in the light assembly 124 may be a COB (chip-on board) type. The COB light source may be configured such that an LED chip as the light source is directly coupled to the substrate 122. Thus, a process can be simplified. Further, a resistance can be reduced, and hence a loss of energy resulting from heat can be reduced. Namely, power efficiency of the light assembly 124 can increase. The COB light source can provide the brighter lighting and can be implemented to be thinner and lighter than a related art.

The light guide plate 128 may be positioned in front of the light assembly 124. The light guide plate 128 may function to widely spread light incident from the light assembly 124. Although not shown, a surface of the light guide plate 128 adjacent to the light assembly 124 may be formed in a stepped shape. A lower surface of the light guide plate 128 may be formed in an upwardly inclined shape and may reflect light incident from the light assembly 124 to the front.

The reflective sheet 126 may be positioned in the rear of the light guide plate 128. The reflective sheet 126 may reflect light emitted from the light assembly 124 to the front. The reflective sheet 126 may again reflect light reflected from the light guide plate 128 to the front.

The reflective sheet 126 may include at least one of metal and metal oxide each of which is a reflection material. The reflective sheet 126 may include metal and/or metal oxide having a high reflectance, for example, at least one of aluminum (Al), silver (Ag), gold (Au), and titanium dioxide ($TiO_2$).

The reflective sheet 126 may be formed by depositing and/or coating metal or metal oxide. An ink including a metal material may be printed on the reflective sheet 126. A deposition layer may be formed on the reflective sheet 126 using a heat deposition method, an evaporation method, or a vacuum deposition method such as a sputtering method. A coating layer and/or a printing layer may be formed on the reflective sheet 126 using a printing method, a gravure coating method or a silk screen method.

A diffusion plate (not shown) may be further included on a front surface of the light guide plate 128. The diffusion plate may diffuse light emitted from the light guide plate 128 to the front.

An air gap may be positioned between the light guide plate 128 and the optical sheet 125. The air gap may serve as a buffer capable of widely spreading light emitted from the light assembly 124. A resin may be deposited on the light assembly 124 and/or the reflective sheet 126. The resin may function to diffuse light emitted from the light assembly 124.

The optical sheet 125 may be positioned in front of the light guide plate 128. A rear surface of the optical sheet 125 may be adhered to the light guide plate 128, and a front surface of the optical sheet 125 may be adhered to a rear surface of the display panel 110.

The optical sheet 125 may include at least one sheet. More specifically, the optical sheet 125 may include one or more prism sheets and/or one or more diffusion sheets. A plurality of sheets included in the optical sheet 125 may be in an attachment and/or adhesion state.

The optical sheet 125 may include a plurality of sheets having different functions. For example, the optical sheet 125 may include first to third optical sheets 125a to 125c. The first optical sheet 125a may function as a diffusion sheet, and the second and third optical sheets 125b and 125c may function as a prism sheet. A number and/or a position of the diffusion sheets and the prism sheets may be changed. For example, the optical sheet 125 may include the first optical sheets 125a as the diffusion sheet and the second optical sheet 125b as the prism sheet.

The diffusion sheet may prevent light coming from the light guide plate 128 from being partially concentrated and may further uniformize a luminance of light. The prism sheet may concentrate light coming from the diffusion sheet and may enable light to be vertically incident on the display panel 110.

The coupling portion 125d may be formed on at least one of edges of the optical sheet 125. The coupling portion 125d may be formed on at least one of the first to third optical sheets 125a to 125c.

The coupling portion 125d may be formed at an edge of a long side of the optical sheet 125. The coupling portion 125d on a first long side and the coupling portion 125d on a second long side may be asymmetric. For example, a number and/or a position of the coupling portions 125d on the first long side may be different from a number and/or a position of the coupling portions 125d on the second long side.

Referring to FIG. 5, a backlight unit 120 may include an optical layer 123 including a substrate 122, at least one light assembly 124, a reflective sheet 126, and a diffusion plate 129, and an optical sheet 125 positioned at a front surface of the optical layer 123.

The substrate 122 may be configured as a plurality of straps, which is extended in the first direction and is spaced from one another by a predetermined distance in the second direction perpendicular to the first direction.

At least one light assembly 124 may be mounted on the substrate 122. The substrate 122 may have an electrode pattern for connecting an adaptor to the light assembly 124. For example, a carbon nanotube electrode pattern for connecting the adaptor to the light assembly 124 may be formed on the substrate 122.

The substrate 122 may be formed of at least one of polyethylene terephthalate (PET), glass, polycarbonate (PC), and silicon. The substrate 122 may be a printed circuit board (PCB) on which at least one light assembly 124 is mounted.

The light assembly 124 may be disposed on the substrate 122 at predetermined intervals in the first direction. A diameter of the light assembly 124 may be greater than a width of the substrate 122. Namely, the diameter of the light assembly 124 may be greater than a length of the substrate 122 in the second direction.

The light assembly 124 may be a light emitting diode (LED) chip or a LED package including at least one LED chip.

The light assembly 124 may be configured as a colored LED emitting at least one of red, green, and blue light or a white LED. The colored LED may include at least one of a red LED, a green LED, and a blue LED.

A light source included in the light assembly 124 may be a COB (chip-on board) type. The COB light source may be configured such that an LED chip as the light source is directly coupled to the substrate 122. Thus, a process can be simplified. Further, a resistance can be reduced, and hence a loss of energy resulting from heat can be reduced. Namely, power efficiency of the light assembly 124 can increase. The COB light source can provide the brighter lighting and can be implemented to be thinner and lighter than a related art.

The reflective sheet 126 may be positioned at a front surface of the substrate 122. The reflective sheet 126 may be positioned in an area excluding a formation area of the light assembly 124 of the substrate 122. Namely, the reflective sheet 126 may have a plurality of holes 235.

The reflective sheet 126 may reflect light emitted from the light assembly 124 to the front. Further, the reflective sheet 126 may again reflect light reflected from the diffusion plate 129.

The reflective sheet 126 may include at least one of metal and metal oxide each of which is a reflection material. The reflective sheet 126 may include metal and/or metal oxide having a high reflectance, for example, at least one of aluminum (Al), silver (Ag), gold (Au), and titanium dioxide ($TiO_2$).

The reflective sheet 126 may be formed by depositing and/or coating metal or metal oxide on the substrate 122. An ink including a metal material may be printed on the reflective sheet 126. A deposition layer may be formed on the reflective sheet 126 using a heat deposition method, an evaporation method, or a vacuum deposition method such as a sputtering method. A coating layer and/or a printing layer may be formed on the reflective sheet 126 using a printing method, a gravure coating method or a silk screen method.

An air gap may be positioned between the reflective sheet 126 and the diffusion plate 129. The air gap may serve as a buffer capable of widely spreading light emitted from the light assembly 124. A supporter 200 may be positioned between the reflective sheet 126 and the diffusion plate 129, so as to keep the air gap.

A resin may be deposited on the light assembly 124 and/or the reflective sheet 126. The resin may function to diffuse light emitted from the light assembly 124. The diffusion plate 129 may upwardly diffuse light emitted from the light assembly 124.

The optical sheet 125 may be positioned at a front surface of the diffusion plate 129. A rear surface of the optical sheet 125 may be adhered to the diffusion plate 129, and a front surface of the optical sheet 125 may be adhered to a rear surface of the display panel 110.

The optical sheet 125 may include at least one sheet. More specifically, the optical sheet 125 may include one or more prism sheets and/or one or more diffusion sheets. A plurality of sheets included in the optical sheet 125 may be in an attachment and/or adhesion state.

The optical sheet 125 may include a plurality of sheets having different functions. For example, the optical sheet 125 may include first to third optical sheets 125a to 125c. The first optical sheet 125a may function as a diffusion sheet, and the second and third optical sheets 125b and 125c may function as a prism sheet. A number and/or a position of the diffusion sheets and the prism sheets may be changed. For example, the optical sheet 125 may include the first optical sheets 125a as the diffusion sheet and the second optical sheet 125b as the prism sheet.

The diffusion sheet may prevent light coming from the diffusion plate from being partially concentrated and may further uniformize a diffusion of light. The prism sheet may concentrate light coming from the diffusion sheet and may enable light to be vertically incident on the display panel 110.

A coupling portion 125d may be formed on at least one of edges of the optical sheet 125. The coupling portion 125d may be formed on at least one of the first to third optical sheets 125a to 125c.

The coupling portion 125d may be formed at an edge of a long side of the optical sheet 125. The coupling portion 125d on a first long side and the coupling portion 125d on a second long side may be asymmetric. For example, a number and/or a position of the coupling portions 125d on the first long side may be different from a number and/or a position of the coupling portions 125d on the second long side.

Referring to FIG. 6, a wire electrode 232 extended from the front surface of the frame 130 through a wire hole 234 may be connected to one side of a power supply 315. The power supply 315 may be a printed circuit board supplying power to the display device 100. The power supply 315 may convert AC into DC.

The power supply 315 may enable the light assembly 124 positioned on the front surface of the frame 130 to emit light through the wire electrode 232. The other side of the power supply 315 may be connected to a main board 321 through the wire electrode 232. The main board 321 may be spaced from the power supply 315 by a predetermined distance. For example, the main board 321 may be positioned opposite the power supply 315 in the second direction based on the center of the frame 130.

The main board 321 may be a printed circuit board providing an interface for operating the display device 100. Further, the main board 321 may check and control an operation state of the respective components of the display device 100.

The power supply 315 and the main board 321 may be connected to a timing controller board 319 through the wire electrode 232. The timing controller board 319 may be a printed circuit board transmitting electric power or signals received from the power supply 315 or the main board 321 to the display panel 110. The timing controller board 319 may be electrically connected to the display panel 110 positioned at the front surface of the frame 130 via flat flexible cables (FFC cables) 251.

FIG. 6 illustrates that the respective printed circuit boards are connected to one another, by way of example. However, embodiments are not limited thereto. For example, only at least some of the printed circuit boards may be connected to each other.

FIGS. 7 to 9 illustrate examples of a controller of a display device according to an embodiment of the disclosure.

Referring to FIG. 7, a controller 400 may be positioned in the rear of the display device 100. The controller 400 may be installed at the rear surface of the frame 130. The controller 400 may include a plurality of controllers 400.

The controller 400 may provide power for the display device 100, obtain image information from the outside, and enable the display device 100 to display an image. For example, the controller 400 may be a power supply unit, a driver, a main board, and/or a timing controller (T-CON) board.

In the following description, in the description of the plurality of controllers 400 or a control module 600, a structural difference will be mainly described. In this instance, a function of the plurality of controllers 400 or the control module 600 may be variously changed.

The display device 100 may include a plurality of controllers 400, a bridge unit 500, and a control module 600. The plurality of controllers 400 may include first to seventh controllers 410 to 470. The control module 600 may be detached from the rear of the display device 100 or from the rear surface of the frame 130. The control module 600 may be detached from the rear of the display device 100 or from the rear surface of the frame 130 while sliding laterally.

The bridge unit 500 may be electrically connected to the plurality of controllers 400, and the control module 600 may be electrically connected to the bridge unit 500. Namely, the bridge unit 500 may electrically connect at least one of the plurality of controllers 400 to the control module 600.

The first controller 410 may be a circuit for driving the display panel 110. For example, the first controller 410 may be a driver. The second controller 420 may be a circuit for driving the display panel 110. For example, the second controller 420 may be a driver.

The first controller 410 and/or the second controller 420 may be electrically connected to a radio receiver 480. The radio receiver 480 may provide an input signal for the first controller 410 and/or the second controller 420. For example, the radio receiver 480 may be an infrared receiver.

The third controller 430 may be a circuit for providing a signal for the display panel 110, etc. so as to adjust an image of the display device 100. For example, the third controller 430 may be a T-CON board.

The fourth to seventh controllers 440 to 470 may be power supply units. The fourth controller 440 may be a circuit to which external power is input. For example, the fourth controller 440 may be a power supply unit to which AC power is input. The fifth to seventh controllers 450 to 470 may be power supply units that distribute power to the first to third controllers 410 to 430. The fourth to seventh controllers 440 to 470 may be to distribute power to the large-sized display device 100 that consumes high power.

The bridge unit 500 may be installed on the rear surface of the frame 130. In this instance, the bridge unit 500 may be fixed to the rear surface of the frame 130. The bridge unit 500 may be electrically connected to the first to seventh controllers 410 to 470.

The control module 600 may be mounted on the rear surface of the frame 130. The control module 600 may be detached from the rear surface of the frame 130. When the control module 600 is mounted on the rear surface of the frame 130, the control module 600 may be electrically connected to the bridge unit 500.

The control module 600 may include a circuit for processing image information so that the display device 100 can display an image. Namely, the control module 600 may provide an image signal for at least one of the first to seventh controllers 410 to 470 via the bridge unit 500, and thus the display device 100 may be driven.

The control module 600 may include at least one microprocessor for processing image information. The control module 600 may include a plurality of microprocessors and may include one integrated microprocessor. In this instance, the control module 600 may generate a lot of heat due to higher power consumption than the first to seventh controllers 410 to 470. Further, the control module 600 may include a circuit that needs to be upgraded according to an image signal processing method.

The control module 600 described above or below and configurations related to the control module 600 may separate the back cover 150 of the display device 100 and may easily perform a process for replacing or exchanging the controllers, in order to upgrade or update the functions of at least one of the controllers installed inside the display device 100.

Further, the control module 600 described above or below and configurations related to the control module 600 may easily upgrade or update the functions of the display device 100 without a process for removing the display device 100 from an installation place or an installation structure and reinstalling again the display device 100, in order to replace or exchange the controllers in case of the large-sized display device 100.

Referring to FIG. 8, the bridge unit 500 may be installed on the rear surface of the frame 130. For example, the bridge unit 500 may be a PCB. The bridge unit 500 may include a connector 510. The connector 510 may include a plurality of connectors 510. The plurality of connectors 510 may include a first connector 512 and a second connector 514. For example, the first connector 512 and the second connector 514 may each include 60 pins and may include a total of 120 pins.

The control module 600 may be positioned adjacent to the bridge unit 500. The control module 600 may be detachably installed on the rear surface of the frame 130. The control module 600 may be mounted on the rear surface of the frame 130 while being inserted into the rear surface of the frame 130 from the side surface of the frame 130. In this instance, the control module 600 may be electrically connected to the bridge unit 500 and disconnected from the bridge unit 500.

Referring to FIG. 9, a rail 610 may be installed on the rear surface of the frame 130. The rail 610 may include a plurality of rails 610. The plurality of rails 610 may include a first rail 612 and a second rail 614.

The first rail 612 may be positioned parallel to the first long side LS1 of the display device 100. The second rail 614 may be positioned parallel to the second long side LS2 of the display device 100. The first rail 612 may face the second rail 614. The first rail 612 may be parallel to the second rail 614. For example, the rail 610 may have a ⊏-shaped cross section. The rail 610 may be a plastic injection.

A slot 620 may be positioned at one end of the rail 610. One end of the slot 620 may overlap one end of the rail 610. The slot 620 may be positioned parallel to the first short side SS1 or the second short side SS2 of the display device 100. For example, one end of the slot 620 may meet one end of the first rail 612, and the other end of the slot 620 may meet one end of the second rail 614. The slot 620 may include a metal.

The control module 600 may be fitted in the slot 620. Further, the control module 600 may slide on the rail 610. Namely, the control module 600 may be inserted through the slot 620 and may be mounted on the rear surface of the frame 130 while being guided by the rail 610.

FIGS. 10 and 11 illustrate examples of a control module according to an embodiment of the disclosure.

Referring to FIG. 10, a bottom plate 630 may provide a flat surface. The bottom plate 630 may be fixed on the rear surface of the frame 130. The bottom plate 630 may include a plurality of bosses B or a plurality of holes.

The bridge unit 500 may be fixed on the bottom plate 630. For example, the bridge unit 500 may be fixed on the bosses B included in the bottom plate 630.

The slot 620 may be positioned to be spaced apart from the bridge unit 500. The slot 620 may be a bracket. The slot 620 may be formed by a bracket and may also be formed by a bracket and the bottom plate 630. The slot 620 may be extended. The slot 620 may be extended in an up-down direction of the bottom plate 630. The slot 620 may be fixed on the bottom plate 630 by the bosses B or the holes.

The rail 610 may connect the bridge unit 500 and the slot 620. This means that one end of the rail 610 may be positioned adjacent to the bridge unit 500 and the other end of the rail 610 may be positioned adjacent to the slot 620. The rail 610 may be fixed on the bottom plate 630 by the bosses B or the holes.

Hence, when the control module 600 is inserted through the slot 620, the control module 600 may move toward the bridge unit 500 while being guided by the rail 610.

Referring to FIG. 11, the control module 600 may include cases 601 and 602, a main board 603, a connector cover 604, and connectors 6031 and 6032. The cases 601 and 602 may include a first case 601 and a second case 602. The first case 601 may be a box, and the second case 602 may be a cover. The second case 602 may be coupled to the first case 601 and may form an upper surface of the cases 601 and 602.

The first case 601 may include a first opening 6011 on one side of the first case 601. The first case 601 may include a second opening 6012 on the other side of the first case 601. The connector cover 604 may be positioned in the first opening 6011. The second case 602 may include a plurality of holes 602h on a plane.

The main board 603 may be accommodated inside the first case 601. The second case 602 may cover the main board 603 and may be coupled to the first case 601. The main board 603 accommodated inside the cases 601 and 602 may be exposed to the outside of the cases 601 and 602 through the first opening 6011 and/or the second opening 6012.

The connectors 6031 and 6032 may be provided on one side of the main board 603. The connectors 6031 and 6032 may protrude from the one side of the main board 603 to the outside of the cases 601 and 602 through the openings 6011 and 6012. The connectors 6031 and 6032 may include a plurality of connectors 6031 and 6032. The plurality of connectors 6031 and 6032 may include a first connector 6031 and a second connector 6032. The first connector 6031 may protrude or be exposed to the outside of the cases 601 and 602 through the first opening 6011 and/or the connector cover 604. The second connector 6032 may protrude or be exposed to the outside of the case through the second opening 6012. The connector cover 604 may be exposed to the outside of the display device 100 through the back cover 150.

FIGS. 12 to 16 illustrate examples of heat dissipation of a control module according to an embodiment of the disclosure.

Referring to FIG. 12, the main board 603 may include a heat generating area HGA or a heat dissipation area HDA.

The main board 603 may be mounted with a plurality of electronic components, and the heat generating area HGA may be formed by at least one of the plurality of electronic components. The heat generating area HGA may include a first heat generating area HGA1 and a second heat generating area HGA2. For example, the heat generating area HGA may be an area in which a microprocessor, etc. are positioned.

An area of the first heat generating area HGA1 and/or the second heat generating area HGA2 may be limited by a size of the electronic component positioned in the first heat generating area HGA1 and/or the second heat generating area HGA2. This means that a heat dissipation area, i.e., heat dissipation efficiency of the first heat generating area HGA1 and/or the second heat generating area HGA2 may be limited.

From another point of view, if an area of a first heat dissipation area HDA1 and/or a second heat dissipation area HDA2 is limited, a heat transfer area to the outside air may be limited, and thus heat dissipation efficiency may be limited.

Referring to FIG. 13, the area of the first heat generating area HGA1 and/or the second heat generating area HGA2 may be expanded by the second case 602. The second case 602 may contact the first heat generating area HGA1 and/or the second heat generating area HGA2, and thus the heat generating area HGA may be expanded to the entire area of the second case 602. In other words, the entire area of the second case 602 may be the heat dissipation area HDA by the second case 602. Thus, the heat dissipation efficiency of heat generated in the main board 603 can increase.

Referring to FIG. 14, a plurality of holes 602h may be formed in the plane of the second case 602. The plurality of holes 602h can further improve the heat dissipation efficiency of the control module 600. This will be described with reference to FIGS. 15 and 16.

Referring to FIG. 15, heat generated in an electronic component MP (e.g., a microprocessor) mounted on the main board 603 accommodated inside the cases 601 and 602 may be primarily transferred to the second case 602 and may be discharged to the outside.

In this instance, heat generated in the electronic component MP may remain in a space inside the cases 601 and 602. It may take much time for the remaining heat to escape to the outside of the cases 601 and 602.

Referring to FIG. 16, heat generated in an electronic component MP (e.g., a microprocessor) mounted on the main board 603 accommodated inside the cases 601 and 602 may be primarily transferred to the second case 602 and may be discharged to the outside.

Then, the heat generated in the electronic component MP may flow in a space inside the cases 601 and 602. In this instance, the outside air may enter inside the cases 601 and 602 through the holes 602h included in the second case 602, and heat inside the cases 601 and 602 may be discharged to the outside of the cases 601 and 602 through the holes 602h included in the second case 602. A heat dissipation effect of the control module 600 can increase.

FIGS. 17 to 25 illustrate examples of attaching and detaching a control module according to an embodiment of the disclosure.

Referring to FIG. 17, the control module 600 may be inserted into the slot 620. The control module 600 inserted into the slot 620 may move to the inside of the bottom plate 630 while being guided along the rail 610 starting at one end of the rail 610. The control module 600 guided by the rail 610 may move up to the connector 510.

Referring to FIG. 18, the control module 600 may contact the connector 510. Namely, the connector 6032 included in the control module 600 may be connected to the connector 510 included in the bridge unit 500. Hence, the control module 600 may be electrically connected to the bridge unit 500.

Referring to FIG. 19, a stopper ST may be formed on an upper surface of the bottom plate 630. The stopper ST may be positioned adjacent to the bridge unit 500. The stopper ST may limit a position of the control unit 600 moving on the rail 610. Namely, the control module 600, which is guided by the rail 610 and inserted into the bottom plate 630, may stop moving while meeting the stopper ST. In this instance, the stopper ST may restrict a position where the connector 6032 included in the control module 600 contacts the connector 510 included in the bridge unit 500. Hence, a damage of the connectors 510 and 6032 resulting from the insertion of the control module 600 can be prevented.

The stopper ST may include a plurality of stoppers ST1 and ST2. The plurality of stoppers ST1 and ST2 may face the slot 620 with the rail 610 interposed therebetween. The plurality of stoppers ST1 and ST2 may include a first stopper ST1 and a second stopper ST2.

The first stopper ST1 may be positioned between the connector 6032 included in the control module 600 and the connector 510 included in the bridge unit 500. Namely, the first stopper ST1 may be configured such that the connector 6032 included in the control module 600 and the connector 510 included in the bridge unit 500 are connected to each other at a proper position or at a right position.

The second stopper ST2 may be formed at a position spaced apart from the first stopper ST1 along a longitudinal direction of the control module 600 in a state where the control module 600 is inserted into the rail 610. The second stopper ST2 can prevent the control module 600 from being out of its position in a state where the control module 600 is inserted into the rail 610.

Referring to FIG. 20, a guide groove GH may be formed on one surface of the control module 600. The guide groove GH may be formed on an outer surface of the first case 601. A position of the guide groove GH may be adjacent to one side of the first case 601 in a rear surface of the first case 601.

Further, the bottom plate 630 may include a guide protrusion GP that is fitted in the guide groove GH. The guide protrusion GP may be formed on the upper surface of the bottom plate 630. The guide protrusion GP may be closer to the slot 620 than the position of the stopper ST. Hence, when the control module 600 is inserted through the slot 620 by the rail 610, the guide protrusion GP may be fitted in the guide groove GH.

In this instance, a direction in which the control module 600 is inserted into the slot 620 may be determined. Namely, it means that there may be directionality in the process for inserting the control module 600 into the slot 620. For example, when the control module 600 is inserted in the opposite direction to a given insertion direction, the control module 600 may not be inserted up to the stopper ST.

Referring to FIG. 21, the control module 600 may be inserted into the slot 620 in the proper direction or in a right direction. The control module 600 may be inserted into the slot 620 and guided toward the stopper ST by the rail 610. In the process for inserting the control module 600, the guide groove GH may be positioned on the same straight line L1 as the guide protrusion GP. Namely, the guide groove GH and the guide protrusion GP may be positioned on the same straight line L1 in an insertion direction of the control module 600.

Referring to FIG. 22, when the control module 600 is inserted into the slot 620 in the proper direction or in a right direction, one side of the control module 600 is caught by the stopper ST and may be no longer inserted. In this instance, the guide protrusion GP may be in a state being inserted into the guide groove GH.

Referring to FIG. 23, the control module 600 may be inserted into the slot 620 in the opposite direction. The control module 600 may be inserted into the slot 620 and guided toward the stopper ST by the rail 610. In the process for inserting the control module 600, the guide groove GH may be positioned on a straight line different from the guide protrusion GP. For example, when the guide groove GH moves on a straight line L2, the guide protrusion GP may be positioned on a straight line L1. Namely, the guide groove GH and the guide protrusion GP may be positioned on the different straight lines L1 and L2 in an insertion direction of the control module 600.

Referring to FIG. 24, when the control module 600 is inserted into the slot 620 in the opposite direction, one side of the control module 600 does not reach the stopper ST and is caught by the guide protrusion GP. Hence, the control module 600 may be no longer inserted.

If a direction in which the control module 600 is inserted into the slot 620 does not match a direction in which the connector 6032 of the control module 600 is connected to the connector 510 of the bridge unit 500, the connectors 510 and 6032 may be damaged. In this instance, the connector 6032 of the control module 600 can be stably connected to the connector 510 of the bridge unit 500 by preventing the control module 600 from being inserted in the opposite direction using the guide protrusion GP and the guide groove GH.

Referring to FIG. 25, the display device 100 may include the back cover 150. The back cover 150 may be coupled to the rear surface of the frame 130. The back cover 150 may include an opening 1500P at its one side. In this instance, the control module 600 may be detached from the side of the back cover 150 while being inserted into the display device 100. The control module 600 may be inserted into the back cover 150 through the opening 1500P.

The opening 1500P may be positioned adjacent to the slot 620 described above. The position of the opening 1500P may correspond to the position of the slot 620. Namely, the control module 600 may be inserted through the opening 1500P of the back cover 150, and at the same time may be inserted into the slot 620.

Some embodiments of the disclosure described above or other embodiments are not mutually exclusive or distinct from each other. Some embodiments of the disclosure described above or other embodiments may be used jointly or combined with each other in configuration or function.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

What is claimed is:

1. A display device comprising:
   a display panel;
   a frame positioned at a rear of the display panel;
   a back cover positioned at a rear of the frame;
   a controller installed between the frame and the back cover;
   a control module movable between the frame and the back cover;
   a bridge unit installed between the frame and the back cover, electrically connected to the controller, and electrically connected to the control module when the control module is inserted between the frame and the back cover;
   a slot installed in the frame, the control module being insertable into the slot; and
   a rail positioned between the slot and the bridge unit and extended so that one end of the rail is adjacent to a portion of the slot and the other end is adjacent to the bridge unit,
   wherein the control module slides on the rail.

2. The display device of claim 1, further comprising:
a stopper formed between a slot and the bridge unit and adjacent to the bridge unit, the stopper protruding from the frame toward the back cover.

3. The display device of claim 2, further comprising:
a guide protrusion formed between the slot and the stopper and adjacent to the stopper, the guide protrusion protruding from the frame toward the back cover; and
a guide groove formed on one surface of the control module, the guide protrusion being inserted into the guide groove,
wherein the guide protrusion and the guide groove are positioned on the same straight line extended in an insertion direction of the control module.

4. The display device of claim 3, wherein the rail includes:
a first rail positioned on one side of the control module; and
a second rail positioned on the other side of the control module,
wherein the guide groove and the guide protrusion are adjacent to one of the first rail or the second rail.

5. The display device of claim 1, wherein the control module includes:
a first case providing an internal accommodation space;
a second case covering the first case; and
a main board embedded in the first case, at least a portion of the main board being in contact with the second case.

6. The display device of claim 5, wherein the second case includes a plurality of holes.

7. The display device of claim 1, wherein the control module is inserted inside the back cover from an outside surface of the back cover.

8. The display device of claim 1, wherein the controller and the bridge unit are fixed to a rear surface of the frame,
wherein the control module electrically contacts the bridge unit, and a portion of the control module is exposed to an outside of the display device.

9. The display device of claim 1, wherein the control module includes:
a first connector exposed to one side of the back cover; and
a second connector electrically connected to the bridge unit.

* * * * *